United States Patent
Takeda et al.

(10) Patent No.: US 10,947,616 B2
(45) Date of Patent: Mar. 16, 2021

(54) METHOD FOR FORMING VAPOR DEPOSITION PATTERN, PRESSING-PLATE-INTEGRATED TYPE PRESSING MEMBER, VAPOR DEPOSITION APPARATUS, AND METHOD FOR PRODUCING ORGANIC SEMICONDUCTOR ELEMENT

(71) Applicant: Dai Nippon Printing Co., Ltd., Tokyo (JP)

(72) Inventors: Toshihiko Takeda, Tokyo (JP); Yoshinori Hirobe, Tokyo (JP); Yoshiko Miyadera, Tokyo (JP); Katsunari Obata, Tokyo (JP); Naoto Yamada, Mitsuke (JP)

(73) Assignee: Dai Nippon Printing Co., Ltd., Tokyo (JP)

( * ) Notice: Subject to any disclaimer, the term of this patent is extended or adjusted under 35 U.S.C. 154(b) by 309 days.

(21) Appl. No.: 15/566,321

(22) PCT Filed: Apr. 15, 2016

(86) PCT No.: PCT/JP2016/062151
§ 371 (c)(1),
(2) Date: Jan. 24, 2018

(87) PCT Pub. No.: WO2016/167358
PCT Pub. Date: Oct. 20, 2016

(65) Prior Publication Data
US 2018/0148822 A1 May 31, 2018

(30) Foreign Application Priority Data
Apr. 17, 2015 (JP) .............................. JP2015-085137

(51) Int. Cl.
*C23C 14/04* (2006.01)
*C23C 16/04* (2006.01)
(Continued)

(52) U.S. Cl.
CPC ............ *C23C 14/042* (2013.01); *C23C 14/24* (2013.01); *C23C 16/042* (2013.01); *H01L 51/0011* (2013.01); *H01L 51/56* (2013.01)

(58) Field of Classification Search
CPC .. C23C 16/042; C23C 14/042; H01L 51/0011
See application file for complete search history.

(56) References Cited

U.S. PATENT DOCUMENTS

| 6,265,324 | B1 | 7/2001 | Tsutsui et al. |
| 2005/0130356 | A1* | 6/2005 | Yotsuya ................ H01L 51/001 438/172 |

(Continued)

FOREIGN PATENT DOCUMENTS

| JP | S56-065980 A1 | 6/1981 |
| JP | 2000-178732 A1 | 6/2000 |

(Continued)

OTHER PUBLICATIONS

International Search Report and Written Opinion (Application No. PCT/JP2016/062151) dated Jun. 21, 2016.
(Continued)

*Primary Examiner* — Elizabeth A Burkhart
(74) *Attorney, Agent, or Firm* — Burr & Brown, PLLC

(57) ABSTRACT

In a method for forming a vapor deposition pattern using a vapor deposition mask provided with a plurality of openings corresponding to a pattern that is produced by vapor deposition, and forming a vapor deposition pattern in a vapor deposition target, the method includes a close contact step of disposing the vapor deposition mask on one surface side of the vapor deposition target, disposing a pressing member
(Continued)

and a magnetic plate in layer in this order on the other surface side of the vapor deposition target, and bringing the vapor deposition target and the vapor deposition mask into close contact with each other by using magnetism of the magnetic plate, and a vapor deposition pattern forming step of causing a vapor deposition material released from a vapor deposition source to adhere to the vapor deposition target through openings after the close contact step, and forming the vapor deposition pattern in the vapor deposition target.

6 Claims, 17 Drawing Sheets

(51) Int. Cl.
 *C23C 14/24* (2006.01)
 *H01L 51/00* (2006.01)
 *H01L 51/56* (2006.01)

(56) References Cited

U.S. PATENT DOCUMENTS

| | | | |
|---|---|---|---|
| 2007/0184195 A1 | 8/2007 | Hatakeyama et al. | |
| 2009/0124033 A1* | 5/2009 | Moriyama | H01L 51/0011 438/29 |
| 2009/0286447 A1 | 11/2009 | Kobayashi | |
| 2010/0024733 A1* | 2/2010 | Soda | C23C 14/12 118/730 |
| 2010/0212596 A1* | 8/2010 | Eida | C23C 14/568 118/729 |
| 2010/0273387 A1 | 10/2010 | Inoue et al. | |
| 2014/0377903 A1* | 12/2014 | Takeda | C23C 14/042 438/99 |
| 2015/0037928 A1 | 2/2015 | Hirobe et al. | |

FOREIGN PATENT DOCUMENTS

| | | |
|---|---|---|
| JP | 2005-222729 A1 | 8/2005 |
| JP | 2006-265650 A1 | 10/2006 |
| JP | 2007-119895 A1 | 5/2007 |
| JP | 2007-207632 A1 | 8/2007 |
| JP | 2008-240088 A1 | 10/2008 |
| JP | 2010-031345 A1 | 2/2010 |
| JP | 2013-163864 A1 | 8/2013 |
| JP | 5288072 B2 | 9/2013 |
| JP | 2013-209697 A1 | 10/2013 |
| JP | 2015-067892 A1 | 4/2015 |
| KR | 2009-0119147 A | 11/2009 |
| WO | 2009/084623 A1 | 9/2009 |

OTHER PUBLICATIONS

Chinese Office Action (Application No. 201680021088.2) dated Mar. 18, 2019 (with English translation).
Korean Office Action (Application No. 10-2017-7032920) dated Dec. 19, 2018 (with English translation).

* cited by examiner

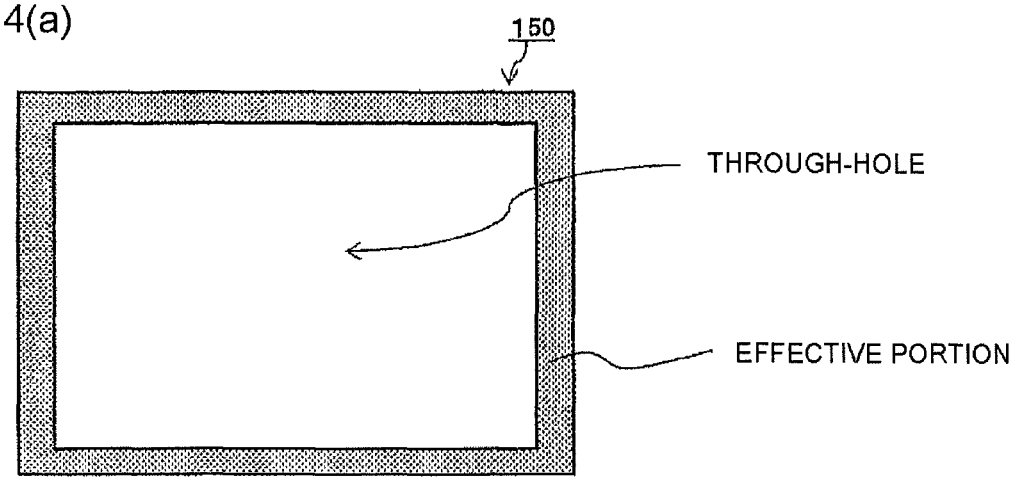
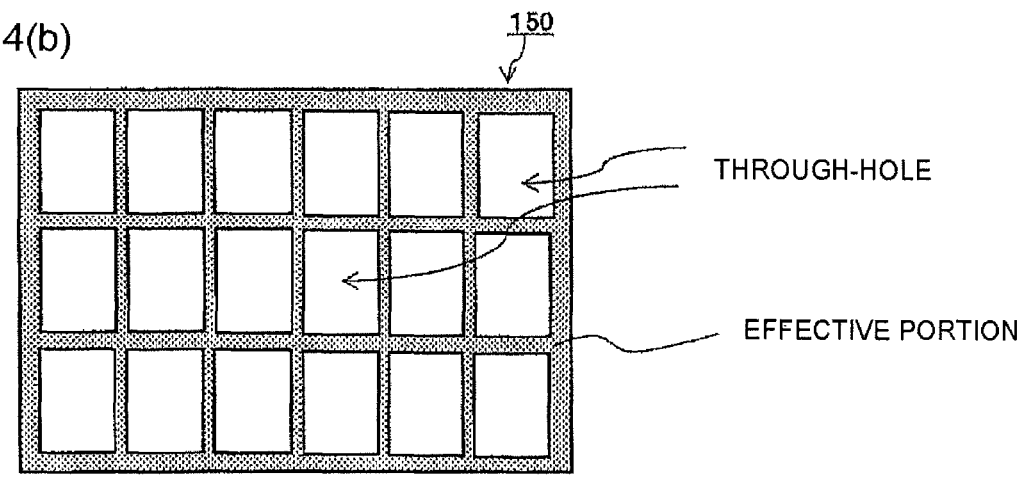
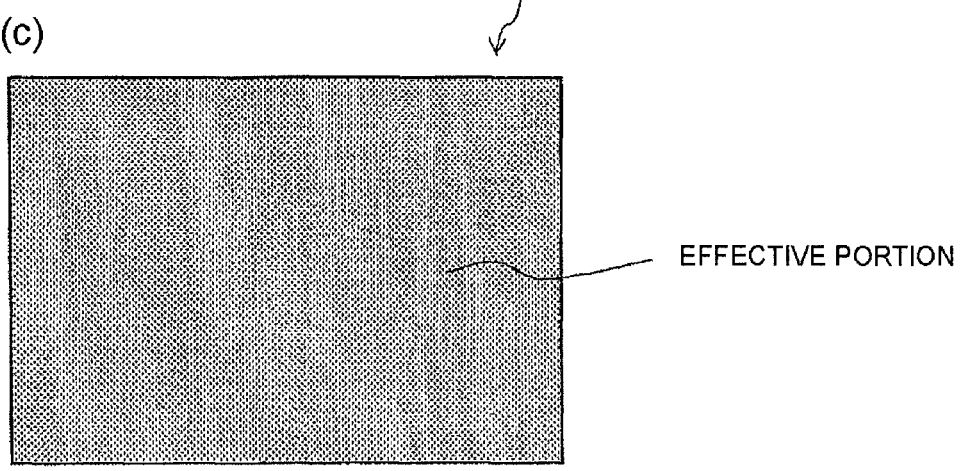

VIEW SEEN FROM RESIN MASK SIDE

VIEW SEEN FROM RESIN MASK SIDE

METHOD FOR FORMING VAPOR DEPOSITION PATTERN, PRESSING-PLATE-INTEGRATED TYPE PRESSING MEMBER, VAPOR DEPOSITION APPARATUS, AND METHOD FOR PRODUCING ORGANIC SEMICONDUCTOR ELEMENT

TECHNICAL FIELD

Embodiments of the present invention relate to a method for forming a vapor deposition pattern, a pressing-plate-integrated type pressing member, a vapor deposition apparatus, and a method for producing an organic semiconductor element.

BACKGROUND ART

Formation of a vapor deposition pattern using a vapor deposition mask is usually performed by bringing the vapor deposition mask provided with openings corresponding to a pattern to be produced by vapor deposition and a vapor deposition target into close contact with each other, and causing a vapor deposition material released from a vapor deposition source to adhere to the vapor deposition target through the openings.

When close contact of the vapor deposition mask and the vapor deposition target is insufficient at the time of formation of the aforementioned vapor deposition pattern, that is, when a gap is generated between the vapor deposition mask and the vapor deposition target, reduction in precision of the vapor deposition pattern formed in the vapor deposition target is caused. This is because the vapor deposition material which is released from the vapor deposition source and passes through the openings goes around from the aforementioned gap when the vapor deposition pattern is formed in the vapor deposition target, and causes a problem that respective vapor deposition patterns that should be originally formed at a predetermined interval connect to each other by the vapor deposition material which goes around from the gap, vapor deposition pattern dimensions become thick or the like.

As a method for bringing the vapor deposition mask and the vapor deposition target into close contact with each other, close contact by a magnetic force is generally known. In this method, a vapor deposition mask is disposed on one surface side of the vapor deposition target, a magnet is disposed on the other surface side of the vapor deposition target, the magnet and the vapor deposition mask attract each other by the magnetic force, and the vapor deposition mask and the vapor deposition target are brought into close contact with each other.

When a vapor deposition mask formed from only a metal is used as the vapor deposition mask, the entire vapor deposition mask can be attracted by the magnet, and a gap is restrained from being generated between the vapor deposition mask and the vapor deposition target. However, when the vapor deposition mask formed from only a metal is used, the mass thereof also increases with upsizing, which becomes a hindrance to handling. Further, there is the problem that it is difficult to form openings corresponding to the pattern to be produced by vapor deposition in a metal plate with high precision by the present metal processing technology.

Under such circumstances, Patent Document 1 proposes a vapor deposition mask formed by stacking a metal mask provided with slits and a resin mask which is positioned on the surface of the metal mask and in which openings corresponding to a pattern to be produced by vapor deposition are arranged in a plurality of rows in the lengthwise and crosswise directions. According to the vapor deposition mask proposed in Patent Document 1, both high definition and lightweight can be satisfied even in the case of being upsized, and moreover, formation of a vapor deposition pattern with high definition can be performed.

CITATION LIST

Patent Document

Patent Document 1: Japanese Patent No. 5288072

SUMMARY

Technical Problem

However, when the vapor deposition mask in which the openings are provided in the resin mask is used as proposed in Patent Document 1, regions in the vicinity of the openings of the resin mask cannot be attracted by the magnet, and when the vapor deposition mask and the vapor deposition target are brought into close contact with each other by the magnet, gaps are generated between the vapor deposition mask and the vapor deposition target in the regions in the vicinities of the openings, which becomes a hindrance to forming a high-definition vapor deposition pattern.

An embodiment of the present disclosure is made in the light of the circumstances as above, and primary objects of the embodiment of the present invention is to provide a method for forming a vapor deposition pattern capable of forming a high-definition vapor deposition pattern by sufficiently satisfying adhesion of a vapor deposition mask and a vapor deposition target, to provide a pressing-plate-integrated type pressing member and a vapor deposition apparatus that are used in formation of the aforementioned vapor deposition pattern, and to provide a method for producing an organic semiconductor element capable of producing an organic semiconductor element with high precision by sufficiently satisfying adhesion of the vapor deposition mask and the vapor deposition target.

Solution to Problem

An embodiment of the present disclosure is a method for forming a vapor deposition pattern using a vapor deposition mask provided with a plurality of openings corresponding to a pattern to be produced by vapor deposition, and forming the pattern in a vapor deposition target, wherein the vapor deposition mask includes a metal, the method including a close contact step of disposing the vapor deposition mask on one surface side of the vapor deposition target, disposing a pressing member and a magnetic plate in layer in this order on the other surface side of the vapor deposition target, and using magnetism of the magnetic plate to bring the vapor deposition target and the vapor deposition mask into close contact with each other, and a vapor deposition pattern forming step of causing a vapor deposition material released from a vapor deposition source to adhere to the vapor deposition target through the openings after the close contact step, and forming a vapor deposition pattern in the vapor deposition target.

Further, an embodiment of the present disclosure is a method for forming a vapor deposition pattern using a vapor deposition mask provided with a plurality of openings corresponding to a pattern to be produced by vapor deposition, and forming the pattern in a vapor deposition target, the method including a close contact step of disposing the vapor deposition mask on one surface side of the vapor deposition target, disposing a pressing member on the other surface side of the vapor deposition target, and pressing the pressing member disposed on the other surface side of the vapor deposition target to the vapor deposition mask side to bring the vapor deposition target and the vapor deposition mask into close contact with each other, and a vapor deposition pattern forming step of causing a vapor deposition material released from a vapor deposition source to adhere to the vapor deposition target through the openings after the close contact step, and forming a vapor deposition pattern in the vapor deposition target.

Further, in the aforementioned method for forming a vapor deposition pattern, the close contact step may be a step of disposing the vapor deposition mask on one surface side of the vapor deposition target, disposing the pressing member on the other surface side of the vapor deposition target, and pressing the vapor deposition target to the vapor deposition mask side by a self weight of the pressing member to bring the vapor deposition target and the vapor deposition mask into close contact with each other. Further, in the aforementioned method for forming a vapor deposition pattern, the pressing member used in the close contact step may be a pressing member in which a thickness changes continuously or non-continuously toward an inner side from an outer periphery of the pressing member. Further, the pressing member used in the close contact step may be a pressing member in which a thickness becomes larger continuously or non-continuously toward an inner side from an outer periphery of the pressing member.

Further, in the aforementioned method for forming a vapor deposition pattern, in the close contact step, a plurality of the pressing members having different thicknesses may be disposed on the other surface side of the vapor deposition target, and the vapor deposition target and the vapor deposition mask may be brought into close contact with each other. Further, when in the close contact step, a plurality of the pressing members having different thicknesses are disposed on the other surface side of the vapor deposition target, the pressing members having larger thicknesses may be disposed toward an inner side from an outer periphery of the vapor deposition target, and the vapor deposition target and the vapor deposition mask may be brought into close contact with each other.

Further, in the aforementioned method for forming a vapor deposition pattern, in the close contact step, a pressing plate may be disposed on a surface on a side of the pressing member that is not in contact with the vapor deposition target in such a manner as to cover a surface of the pressing member, and the vapor deposition target and the vapor deposition mask may be brought into close contact with each other. Further, in the close contact step, a pressing-plate-integrated type pressing member in which the pressing member and the pressing plate are integrated with each other may be disposed on the other surface side of the vapor deposition target, and the vapor deposition target and the vapor deposition mask may be brought into close contact with each other.

Further, in the aforementioned method for forming a vapor deposition pattern, the vapor deposition mask for use in formation of the vapor deposition pattern may be a vapor deposition mask formed by stacking a metal mask provided with a slit, and a resin mask provided with a plurality of openings corresponding to a pattern to be produced by vapor deposition, in a position overlapping the slit.

Further, in the aforementioned method for forming a vapor deposition pattern, the vapor deposition mask for use in formation of the vapor deposition pattern may be a vapor deposition mask in which a metal mask provided with a plurality of slits and a resin mask provided with openings needed to configure a plurality of screens are stacked, and each of the slits is provided in a position overlapping at least one entire screen.

Further, in the aforementioned method for forming a vapor deposition pattern, in the close contact step, the pressing member may be disposed in at least one portion of a region overlapping the slit in a thickness direction, on the other surface side of the vapor deposition target, and the vapor deposition target and the vapor deposition mask may be brought into close contact with each other.

Further, in the aforementioned method for forming a vapor deposition pattern, the vapor deposition mask for use in formation of the vapor deposition pattern may be a metal-frame-equipped vapor deposition mask formed by a vapor deposition mask being fixed to a metal frame.

Further, an embodiment of the present disclosure is a method for producing an organic semiconductor element, and includes a vapor deposition pattern forming step of forming a vapor deposition pattern in a vapor deposition target by using a vapor deposition mask, wherein in the vapor deposition pattern forming step, the aforementioned method for forming a vapor deposition pattern is used.

Further, an embodiment of the present disclosure is a pressing-plate-integrated type pressing member, the pressing-plate-integrated type pressing member being disposed between a vapor deposition target and a magnetic plate, when a vapor deposition mask including a metal is disposed on one surface side of the vapor deposition target, the magnetic plate is disposed on the other surface side of the vapor deposition target, and the vapor deposition target and the vapor deposition mask are brought into close contact with each other by using a magnetic force of the magnetic plate, wherein one or a plurality of pressing members are provided on a same surface of a pressing plate.

Further, an embodiment of the present disclosure is a pressing-plate-integrated type pressing member, the pressing-plate-integrated type pressing member being disposed on the other surface side of a vapor deposition target when a vapor deposition mask is disposed on one surface side of the vapor deposition target, and being used to press the vapor deposition target to the vapor deposition mask side to bring the vapor deposition target and the vapor deposition mask into close contact with each other, wherein one or a plurality of pressing members are provided on a same surface of a pressing plate.

Further, an embodiment of the present disclosure is a pressing-plate-integrated type pressing member, the pressing-plate-integrated type pressing member being disposed on the other surface side of a vapor deposition target when the vapor deposition mask is disposed on one surface side of the vapor deposition target, and being used to bring the vapor deposition target and the vapor deposition mask into close contact with each other by using a self weight of the pressing-plate-integrated type pressing member, wherein one or a plurality of pressing members are provided on a same surface of a pressing plate.

Further, the pressing-plate-integrated type pressing member in the aforementioned pressing-plate-integrated type pressing member may be a member in which the pressing plate and the pressing member are formed integrally from a same kind of material.

Further, an embodiment of the present disclosure is a vapor deposition apparatus for forming a vapor deposition pattern in a vapor deposition target by using a vapor deposition mask including a metal, the vapor deposition apparatus including a close contact device for bringing a vapor deposition target and a vapor deposition mask into close contact with each other in a stage before forming the vapor deposition pattern in the vapor deposition target, wherein the close contact device is a device that disposes the vapor deposition mask on one surface side of the vapor deposition target, disposes a pressing member and a magnetic plate in layer in this order, on the other surface side of the vapor deposition target, and brings the vapor deposition target and the vapor deposition mask into close contact with each other by using magnetism of the magnetic plate.

Further, an embodiment of the present disclosure is a vapor deposition apparatus for forming a vapor deposition pattern in a vapor deposition target by using a vapor deposition mask, the vapor deposition apparatus including a close contact device for bringing a vapor deposition target and a vapor deposition mask into close contact with each other in a stage before forming the vapor deposition pattern in the vapor deposition target, wherein the close contact device is a device that disposes the vapor deposition mask on one surface side of the vapor deposition target, disposes a pressing member on the other surface side of the vapor deposition target, and presses the pressing member to the vapor deposition mask side to bring the vapor deposition target and the vapor deposition mask into close contact with each other.

Further, an embodiment of the present disclosure is a vapor deposition apparatus for forming a vapor deposition pattern in a vapor deposition target by using a vapor deposition mask, the vapor deposition apparatus including a close contact device for bringing a vapor deposition target and a vapor deposition mask into close contact with each other in a stage before forming the vapor deposition pattern in the vapor deposition target, wherein the close contact device is a device that disposes the vapor deposition mask on one surface side of the vapor deposition target, disposes a pressing member on the other surface side of the vapor deposition target, and presses the vapor deposition target to the vapor deposition mask side to bring the vapor deposition target and the vapor deposition mask into close contact with each other, by a self weight of the pressing member.

Further, the pressing member in the aforementioned vapor deposition apparatus may be a pressing member in which a thickness changes continuously or non-continuously toward an inner side from an outer periphery of the pressing member. Further, in the aforementioned vapor deposition apparatus, the pressing member may be a pressing member in which a thickness becomes larger continuously or non-continuously toward an inner side from an outer periphery of the pressing member.

Further, the pressing member in the aforementioned vapor deposition apparatus may be a pressing-plate-integrated type pressing member in which one or a plurality of pressing members are provided on a same surface of a pressing plate.

Further, the pressing member in the aforementioned vapor deposition apparatus may be a pressing-plate-integrated type pressing member in which a plurality of pressing members having different thicknesses are provided on a same surface of a pressing plate.

Advantageous Effects

According to the method for forming a vapor deposition pattern, the pressing-plate-integrated type pressing member, and the vapor deposition apparatus of an embodiment of the present disclosure, adhesion of the vapor deposition mask and the vapor deposition target can be sufficiently satisfied, and thereby a high-definition vapor deposition pattern can be formed. Further, according to the method for producing an organic semiconductor element of an embodiment of the present disclosure, an organic semiconductor element can be produced with high precision.

BRIEF DESCRIPTION OF DRAWINGS

FIGS. 4(a) to 4(c) are elevation views of the magnetic plates as seen in plan view.

FIG. 7(a) is an elevation view as seen in plan view from a metal mask side, and FIG. 7(b) is a schematic cross-sectional view taken along the line A-A in FIG. 7(a).

DESCRIPTION OF EMBODIMENTS

Hereafter, a method for forming a vapor deposition pattern of an embodiment of the present disclosure is specifically described using the drawings.

<<Method for Forming Vapor Deposition Pattern>>

Figure 1A:
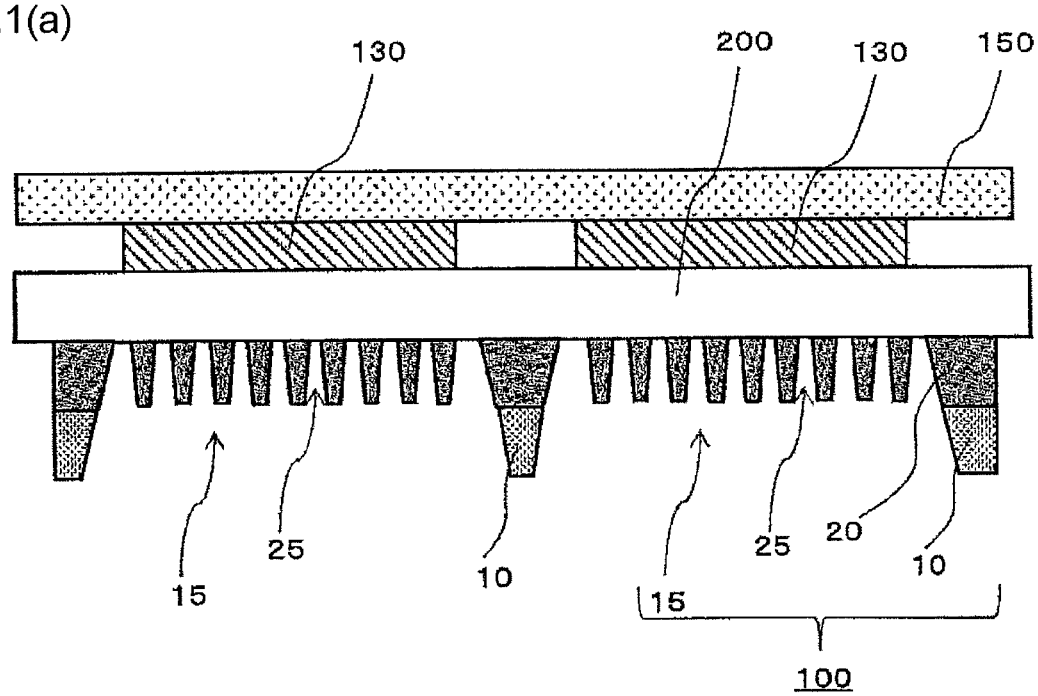
FIG. 1(a) is a schematic cross-sectional view showing a state before bringing a vapor deposition mask and a vapor deposition target into close contact with each other.
Figure 1B:
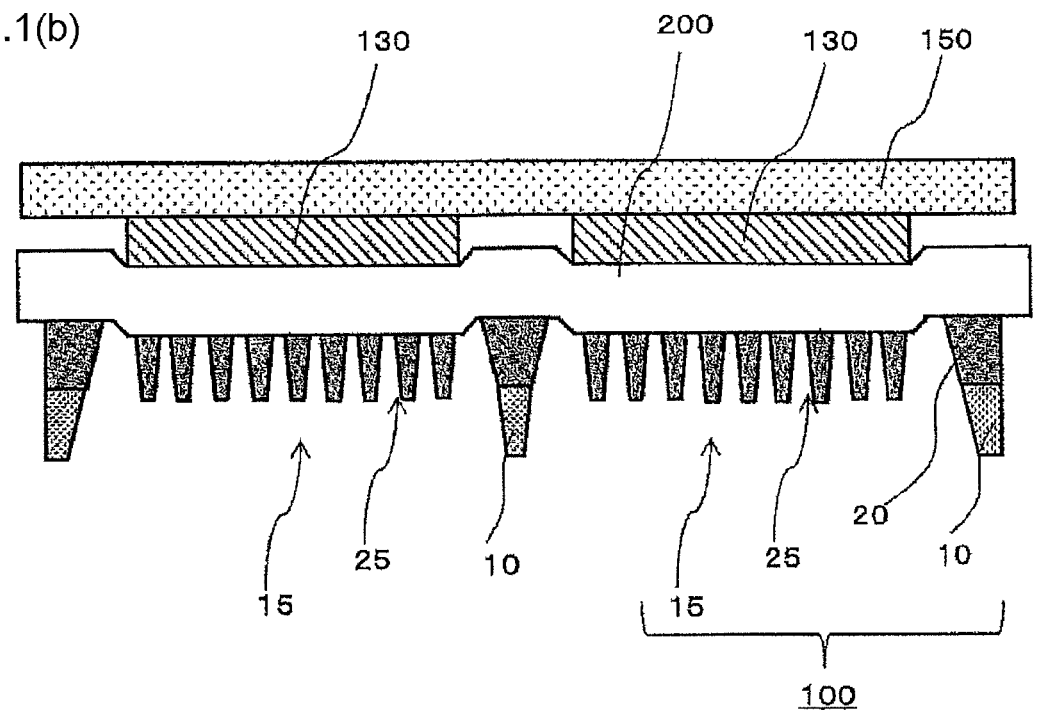
FIG. 1(b) is a schematic cross-sectional view showing a state at a time of the vapor deposition mask and the vapor deposition target being brought into close contact with each other by using magnetism of a magnetic plate.

A method for forming a vapor deposition pattern of an embodiment of the present disclosure (hereafter, referred to as a method for forming a vapor deposition pattern of an embodiment) is a method using a vapor deposition mask provided with a plurality of openings corresponding to a pattern to be produced by vapor deposition, and forming a vapor deposition pattern in a vapor deposition target, and it is characterized in that the method, as shown in FIGS. 1(a) and 1(b), includes a close contact step of disposing a vapor deposition mask 100 on one surface side (an undersurface side, in a mode shown in the figures) of a vapor deposition target 200, disposing a magnetic plate 150 on the other surface side (a top surface side in the mode shown in the figures) of the vapor deposition target 200, and bringing the vapor deposition mask 100 and the vapor deposition target 200 into close contact with each other by using magnetism of the magnetic plate 150, and a vapor deposition pattern forming step of causing a vapor deposition material released from a vapor deposition source to adhere to the vapor deposition target 200 through openings 25 after the close contact step, and forming the vapor deposition pattern in the vapor deposition target 200, wherein in the close contact step, pressing members 130 are disposed between the vapor deposition target 200 and the magnetic plate 150, and the vapor deposition mask 100 and the vapor deposition target 200 are brought into close contact with each other. Note that FIG. 1(a) is a schematic cross-sectional view showing a state before bringing the vapor deposition mask 100 and the vapor deposition target 200 into close contact with each other, and FIG. 1(b) is a schematic cross-sectional view showing a state at a time of the vapor deposition mask 100 and the vapor deposition target 200 being brought into close contact with each other.

<Close Contact Step>

As shown in FIG. 1(a), the close contact step is a step of disposing the vapor deposition mask 100 including a metal on one surface side of the vapor deposition target 200, disposing the magnetic plate 150 on the other surface side of the vapor deposition target 200, and bringing the vapor deposition mask 100 and the vapor deposition target 200 into close contact with each other by using magnetism of the magnetic plate 150. The method for forming a vapor deposition pattern of an embodiment is characterized in that in the close contact step, the pressing members 130 are disposed between the vapor deposition target 200 and the magnetic plate 150, and the vapor deposition mask 100 and the vapor deposition target 200 are brought into close contact with each other. In other words, it is characterized in that the pressing members 130 and the magnetic plate 150 are overlapped in this sequence on the other surface side of the vapor deposition target, and thereby the vapor deposition mask 100 and the vapor deposition target 200 are brought into close contact with each other.

According to the method for forming a vapor deposition pattern of an embodiment including the close contact step of the aforementioned characteristic, by properly disposing the pressing members 130 between the vapor deposition target 200 and the magnetic plate 150, the vapor deposition mask 100 and the vapor deposition target 200 can be brought into close contact with each other without a gap, and it is possible to perform formation of a high-definition vapor deposition pattern.

Hereafter, with respect to adhesion of the vapor deposition mask 100 and the vapor deposition target 200 at the time of the vapor deposition mask 100 and the vapor deposition target 200 being brought into close contact with each other by using the magnetism of the magnetic plate 150, superiority of the method for forming a vapor deposition pattern of an embodiment is described while being compared with an example of a case in which no pressing member 130 is disposed. Note that on explaining the superiority of the method for forming a vapor deposition pattern of an embodiment, the vapor deposition mask 100 which is formed by stacking a metal mask 10 provided with slits 15 and a resin mask 20 provided with a plurality of openings 25 corresponding to a pattern to be produced by vapor deposition, in positions overlapping the slits 15, is described by being cited as an example of the vapor deposition mask 100.

In the close contact step, the vapor deposition mask 100 is disposed on one surface side of the vapor deposition target 200, the magnetic plate 150 is disposed on the other surface side of the vapor deposition target 200, and the magnetic plate 150 and the vapor deposition mask 100 are attracted to each other by using the magnetism of the magnetic plate 150, whereby the vapor deposition mask 100 and the vapor deposition target 200 are brought into close contact with each other. Of the regions of the vapor deposition mask 100, regions capable of being attracted by the magnetic plate 150 are regions that overlap portions constituted of a metal material in a thickness direction, that is, regions overlapping metal portions which are no-slit-formation regions of the metal mask 10 (Hereafter, the metal portions which is the no-slit-formation regions of the metal mask 10 are sometimes referred to simply as "metal portions".) in the thickness direction, and in the regions where the resin mask 20 constituted of a resin material only overlaps the magnetic plate 150 in the thickness direction, the vapor deposition mask 100 and the magnetic plate 150 cannot attract each other.

Figure 2:
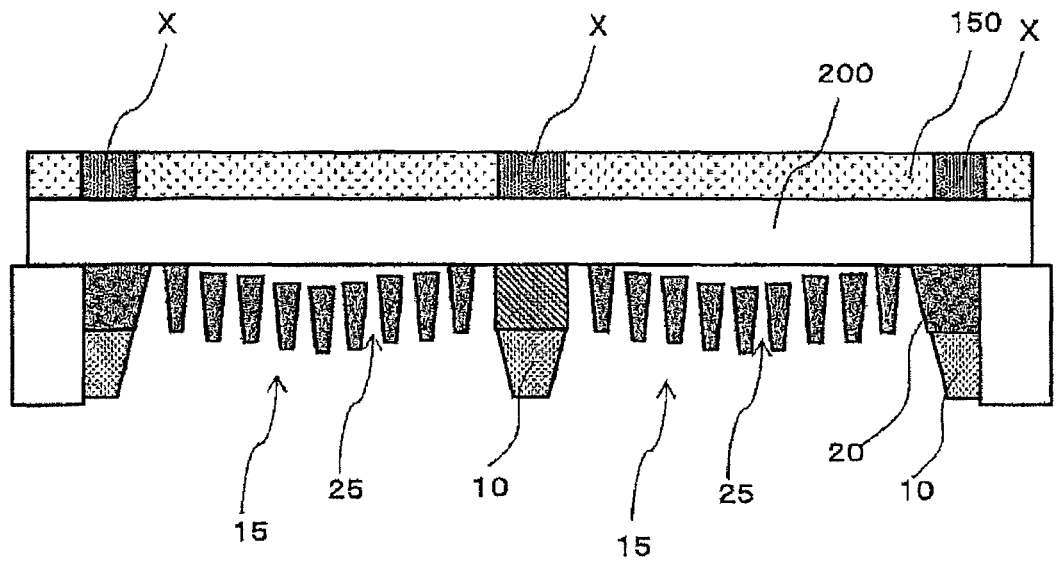
FIG. 2 is a schematic cross-sectional view of a comparative example showing a state at a time of a vapor deposition mask and a vapor deposition target being brought into close contact with each other by using magnetism of a magnetic plate.

FIG. 2 is a comparative example that does not satisfy conditions of the close contact step of the method for forming a vapor deposition pattern of an embodiment, and is a schematic cross-sectional view showing a state at a time of the vapor deposition mask 100 and the vapor deposition target 200 being brought into close contact with each other without disposing the pressing member 130 between the vapor deposition target 200 and the magnetic plate 150. As described above, the vapor deposition mask 100 formed by stacking the metal mask 10 provided with the slits 15 and the resin mask 20 provided with a plurality of openings 25 corresponding to the pattern to be produced by vapor deposition, in the positions overlapping the slits 15, and the magnetic plate 150 can attract each other in the regions (regions that overlap regions shown by reference signs X in FIG. 2 in the thickness direction) where the metal portions of the vapor deposition mask and the magnetic plate 150 overlap one another in the thickness direction, and the regions that overlap only the resin mask 20 constituted of a resin material in the thickness direction cannot be attracted by the magnetic plate 150. Accordingly, a gap tends to be generated between the vapor deposition mask 100 and the vapor deposition target 200 in the regions that cannot be attracted by the magnetic plate 150, that is, portions where the slits 15 of the metal mask 10 and the vapor deposition target 200 overlap one another in the thickness direction.

Thus, the method for forming a vapor deposition pattern of an embodiment is characterized in that in order to restrain a gap from being generated between the vapor deposition mask 100 and the vapor deposition target 200 in the positions overlapping, in the thickness direction, the regions of the vapor deposition mask 100 that cannot be attracted by the magnetic plate 150, in the close contact step, the pressing member 130 is disposed between the vapor deposition target 200 and the magnetic plate 150, and the vapor deposition mask 100 and the vapor deposition target 200 are brought into contact with each other.

According to the close contact step having the aforementioned characteristic, as shown in FIG. 1(b), when the vapor deposition mask 100 and the vapor deposition target 200 are brought into close contact with each other by using the magnetism of the magnetic plate 150, the vapor deposition target 200 can be pressed to a vapor deposition mask 100 side by the pressing members 130 disposed between the vapor deposition target 200 and the magnetic plate 150. The vapor deposition target 200 which is pressed to the vapor deposition mask 100 side plays a role of burying the gap between the vapor deposition mask 100 and the vapor deposition target 200, and thereby a gap can be restrained from being generated between the vapor deposition mask 100 and the vapor deposition target 200 in the regions overlapping the pressing members 130 in the thickness direction. That is, the vapor deposition mask 100 and the vapor deposition target 200 can be brought into close contact with each other with high adhesion. Note that FIG. 1(b) is a schematic cross-sectional view showing a state in which the vapor deposition target 200 is pressed by the pressing member 130. In a mode shown in FIG. 1, a sectional shape in the thickness direction of the vapor deposition target 200 in portions pressed by the pressing members 130 is trapezoidal, but the vapor deposition target 200 can be also pressed to be along a shape of the pressing member 130, depending on materials of the vapor deposition target 200 and the pressing member 130 and the shape of the pressing member 130 (refer to FIG. 11 described later). Further, the vapor deposition target 200 can be also pressed so that the sectional shape in the thickness direction of the vapor deposition target 200 in the portion pressed by the pressing member 130 becomes a circular arc shape (not shown in the figure).

In the above description, as the vapor deposition mask 100, the vapor deposition mask 100 formed by stacking the metal mask 10 provided with the slits 15, and the resin mask 20 provided with a plurality of openings 25 corresponding to the pattern to be produced by vapor deposition, in the positions overlapping the slits 15, is described by being cited as an example, but a mode of the vapor deposition mask 100 for use in the method for forming a vapor deposition pattern of an embodiment and composing members of the vapor deposition mask 100 are not limited in any case. For example, in the method for forming a vapor deposition pattern of an embodiment, a vapor deposition mask formed from only a metal material can be also used as the vapor deposition mask 100. When the vapor deposition mask 100 formed from only the metal material is used, the vapor deposition mask 100 can be attracted to the magnetic plate 150 in all regions of the vapor deposition mask 100, and adhesion of the vapor deposition mask 100 and the vapor deposition target at the time of the vapor deposition mask 100 and the magnetic plate 150 attracting each other can be enhanced as compared with the vapor deposition mask 100 including the resin material as a composition member. However, with the vapor deposition mask 100 formed from only a metal material, the vapor deposition mask 100 and the magnetic plate 150 sometimes cannot attract each other sufficiently depending on a ratio of a metal part, and a material of the metal, and therefore a gap is sometimes generated between the vapor deposition mask 100 and the vapor deposition target 200.

The method for forming a vapor deposition pattern of an embodiment is preferable in the case of using the vapor deposition mask 100 including a resin material in the composition members. Specifically, it is preferable in the case of using the vapor deposition mask 100 having a region that cannot attract the magnetic plate 150 when the vapor deposition mask 100 and the magnetic plate 150 attract each other, that is, vapor deposition mask 100 formed from only a resin material, and the vapor deposition mask 100 formed by stacking the resin mask 20 and the metal mask 10 as described above. Note that in the case of adopting the vapor deposition mask 100 formed from only a resin material, no region that can attract the magnetic plate 150 is present in the vapor deposition mask 100, and in this state, the vapor deposition mask 100 and the magnetic plate 150 cannot attract each other. In this case, a metal-frame-equipped vapor deposition mask formed by fixing the vapor deposition mask formed from only a resin material to a metal frame is adopted, and thereby a frame body portion of the metal frame and the magnetic plate 150 can attract each other. The metal frame is described later.

An arrangement position of the pressing member 130 is not specially limited, and the pressing member 130 can be disposed in a position overlapping a region where adhesion of the vapor deposition mask 100 and the vapor deposition target 200 is insufficient when the vapor deposition mask 100 and the vapor deposition target 200 are brought into close contact with each other. For example, it is preferable to dispose the pressing member 130 in the positions overlapping the slits 15 of the metal mask 10, between the vapor deposition target 200 and the magnetic plate 150, in the aforementioned vapor deposition mask 100.

Figure 3:
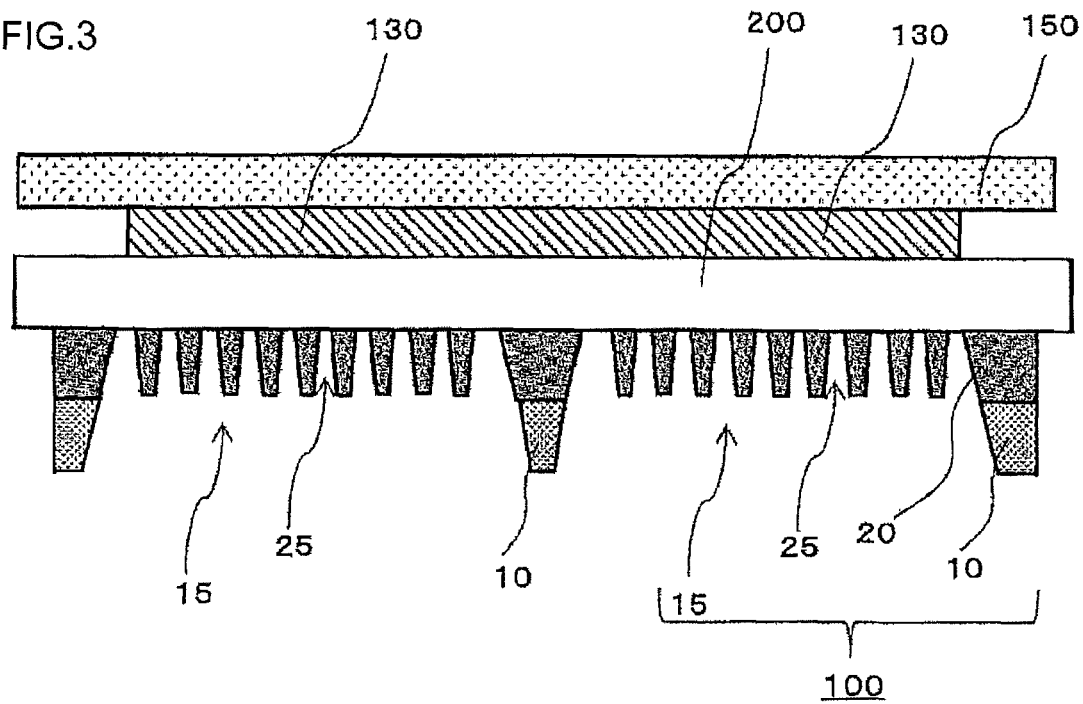
FIG. 3 is a schematic cross-sectional view showing an example of a state before bringing the vapor deposition mask and the vapor deposition target into close contact with each other.

Between the vapor deposition target 200 and the magnetic plate 150, a plurality of pressing members 130 may be disposed as shown in FIG. 1(a), or only one pressing member 130 may be disposed as shown in FIG. 3.

The material of the pressing member 130 is not limited in any case, and may be a metal material, a resin material, a ceramics material, a glass material or any material other than these materials. Above all, a resin material is preferable in a point that the resin material can uniformly press the vapor deposition target in contact with the pressing member 130 and a sufficient pressing effect can be obtained, as compared with a metal material. As the resin material, a polyimide resin or the like can be cited, for example.

Further, a shape of the pressing member 130 on a side in contact with the vapor deposition target 200 may be an R shape, in other words, the shape on the contacting side may be a shape having a curvature (not shown in the figure). A direction of the curvature is not limited, and the shape may have a curvature in a longitudinal direction of the pressing member 130, or may have the curvature in a short side direction. Alternatively, the shape may have the curvature like a semispherical shape. The shape of the pressing member 130 on the side in contact with the vapor deposition target 200 is formed in the shape having a curvature, and thereby the pressing effect of the vapor deposition target by the pressing member 130 can be enhanced.

Further, when an area of the other surface side of the vapor deposition target overlapping the vapor deposition mask 100 in the thickness direction at the time of the other surface side of the vapor deposition target being seen in plan view is set as 100%, a total area of the portion where the pressing member 130 and the vapor deposition target are in contact with each other is preferably 10% or more, is more preferably 25% or more, and is specially preferably 85% or more. By setting the area of the portion where the pressing member and the vapor deposition target are in contact with each other at 10% or more, further enhancement of adhesion of the vapor deposition mask 100 and the vapor deposition target 200 can be achieved.

Note that in the case of using a plurality of pressing members 130, an area of a portion where one pressing member 130 and the vapor deposition target 200 which is in contact with the one pressing member 130 is preferably 200 mm$^2$ or more. By setting the area of the portion where the one pressing member 130 and the vapor deposition target 200 are in contact with each other within the aforementioned preferable range, stress can be restrained from being exerted intensively to the region of the vapor deposition target 200 which is in contact with the one pressing member 130. In other words, when the vapor deposition mask 100 and the vapor deposition target 200 are attracted by the magnetic plate 150, the stress which is exerted on the region of the vapor deposition target 200 which is in contact with the one pressing member 130 can be sufficiently dispersed.

A thickness of the pressing member 130 is not specially limited, and can be properly set with consideration given to the gap that can be generated between the vapor deposition mask 100 and the vapor deposition target 200. The thickness of the pressing member 130 as an example is about 0.01 mm to about 2 mm, about 0.05 mm to about 1 mm, and about 0.1 mm to about 0.7 mm.

The magnetic plate 150 which is disposed on the pressing member 130, or a pressing plate 135 which is described later is a plate piece formed from a magnetic material, and a conventionally known material that can attract a metal material, for example, a conventionally known material can be properly selected and used, which can attract the metal portion of the metal mask 10 in the case of using the vapor deposition mask 100 or the like including the metal mask 10, and a frame portion of a metal frame in the case of using a metal-frame-equipped vapor deposition mask formed by fixing the vapor deposition mask 100 to the metal frame. As an example of the magnetic plate 150, a magnet (magnet), a magnet sheet formed by mixing a magnetic material into a synthetic rubber and the like can be cited.

An arrangement position of the magnetic plate 150 is not specially limited, but in the method for forming a vapor deposition pattern of an embodiment, the magnetic plate 150 is disposed so as to cover at least a part of a surface of the pressing member 130, or at least a part of a surface of the pressing plate 135 described later, in such a manner that the metal portions of the vapor deposition mask and an effective portion of the magnetic plate 150 overlap one another in the thickness direction. Alternatively, the magnetic plate 150 is disposed so as to cover at least a part of the surface of the pressing member 130, or at least a part of the surface of the pressing plate 135 described later, in such a manner that the frame body portion of the metal frame constituting the metal-frame-equipped vapor deposition mask and the effective portion of the magnetic plate 150 overlap each other in the thickness direction. In the latter case, the magnetic plate 150 also can be disposed in such a manner that the metal portion of the vapor deposition mask, the frame body portion of the metal frame, and the effective portion of the magnetic plate 150 overlap one another in the thickness direction. The magnetic plate is disposed so that the metal portion of the vapor deposition mask, or the frame body portion of the metal frame and the effective portion of the magnetic plate 150 overlaps each other in the thickness direction, because when the metal portion or the frame body portion of the metal frame, and the effective portion of the magnetic plate 150 do not overlap each other in the thickness direction, the vapor deposition mask 100 and the magnetic plate 150 cannot be caused to attract each other by using the magnetic force of the magnetic plate.

The shape of the magnetic plate 150 is not specially limited as long as the metal portion of the vapor deposition mask, or the frame body portion of the metal frame, and the effective portion of the magnetic plate 150 can overlap each other in the thickness direction when the magnetic plate 150 is disposed on the vapor deposition target 200 via the pressing plate 135, as described above. For example, a shape of the magnetic plate 150 as seen in plan view can be an optional shape, such as the shapes provided with through-holes to leave the effective portion of the magnetic plate partially as shown in FIGS. 4(a) and 4(b), and the shape in which the all regions are made of the effective portion of the magnetic plate, without providing a through-hole, as shown in FIG. 4(c). Further, in the mode shown in the figure, an outer shape of the magnetic plate 150 as seen in plan view is a rectangular shape, but may be a polygon such as a rhombus, or may be a shape having a curvature such as a circle and an ellipse, for example.

A thickness of the magnetic plate 150 can be determined with a magnetic force or the like of the magnetic plate 150 taken into consideration, and is not specially limited, but as an example, is about 1 mm to about 30 mm, and preferably about 10 mm to about 25 mm.

Figure 5:
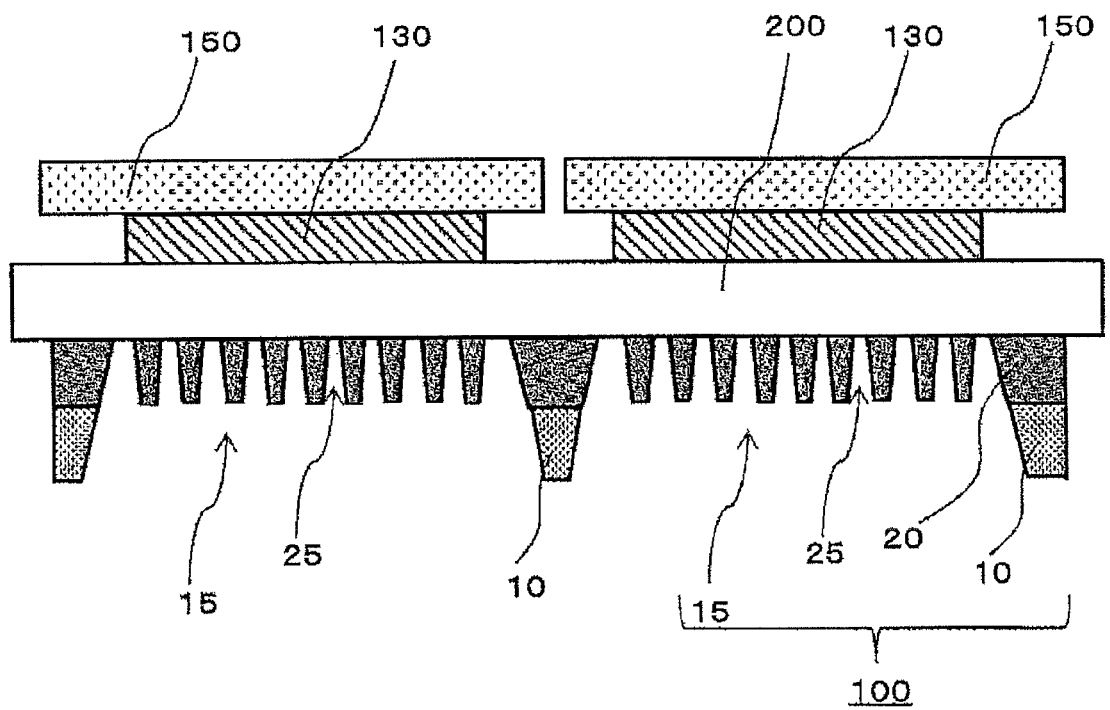
FIG. 5 is a schematic cross-sectional view showing an example of a state before bringing a vapor deposition mask and a vapor deposition target into close contact with each other.

Further, when a plurality of pressing members 130 are disposed on the other surface of the vapor deposition target, if the aforementioned conditions are satisfied, one large-sized magnetic plate 150 (refer to FIG. 1) may be disposed to cover the surfaces of the plurality of pressing members 130 collectively, or the magnetic plate 150 may be disposed on each of the pressing members 130 as shown in FIG. 5.

Note that in the case of using the magnetic plates 150 provided with through-holes as shown in FIGS. 4(a) and 4(b), there can arise a case in which the effective portion of the magnetic plate 150 and the surface of the pressing member 130 do not overlap each other in the thickness direction depending on the position of the through-hole provided in the magnetic plate 150, and the vapor deposition target 200 cannot be pressed to the vapor deposition mask 100 side when the magnetic plate 150 and the vapor deposition mask 100 attract each other. For example, when the entire surface of the pressing plate overlaps the through-hole in the thickness direction, the vapor deposition target 200 cannot be pressed to the vapor deposition mask 100 side when the magnetic plate 150 and the vapor deposition mask 100 attract each other.

Figure 6A:
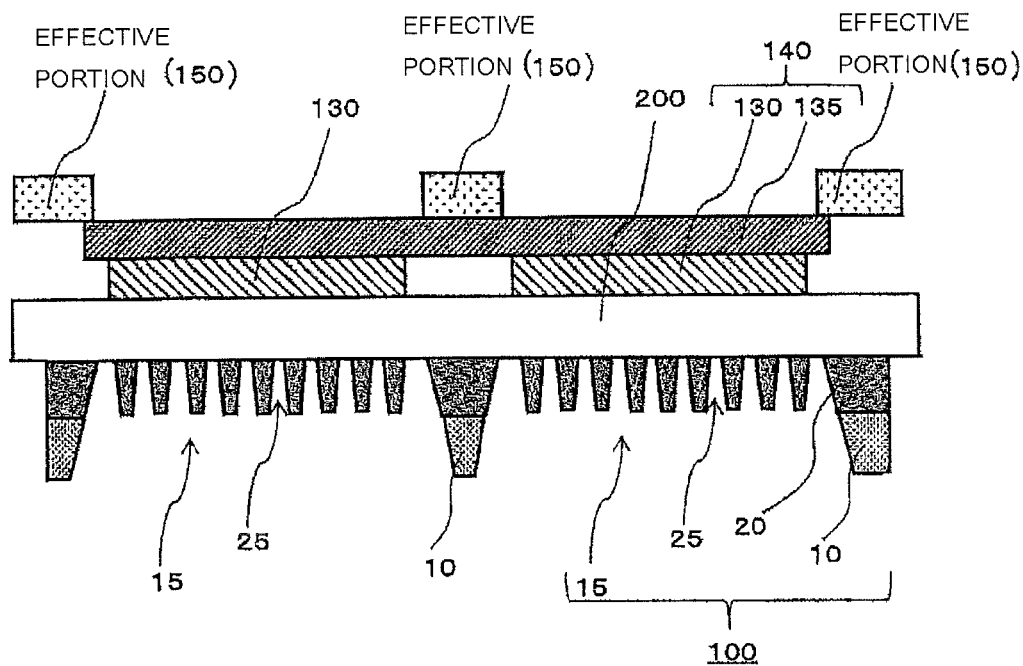
FIGS. 6(a) and 6(b) are schematic cross-sectional views showing examples of a state before bringing a vapor deposition mask and a vapor deposition target into close contact with each other.
Figure 6B:
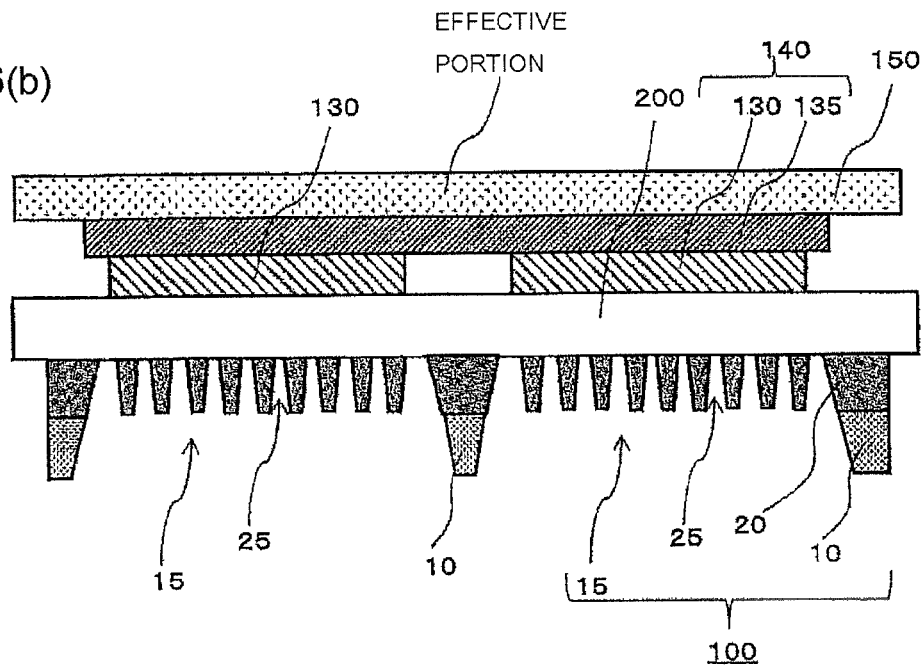

Accordingly, in such a case, as shown in FIG. 6(a), it is preferable to dispose the pressing plate 135 which overlaps at least a part of the surface of the pressing member 130 and the effective portion of the magnetic plate 150 in the thickness direction between the pressing member 130 and the magnetic plate 150, and bring the vapor deposition mask 100 and the vapor deposition target 200 into close contact with each other. By disposing the pressing plate 135 like this, the pressing member 130 can be pressed to a vapor deposition target 200 side by the pressing plate 135 even if the shape of the magnetic plate 150, for example, the shape of the magnetic plate 150 as seen in plan view is the shape as shown in FIG. 4(a) or 4(b). That is, the pressing member 130 can be pressed to the vapor deposition target 200 side regardless of the shape of the magnetic plate 150. Further, when the shape of the magnetic plate 150 as seen in plan view is the shape as shown in FIG. 4(c), the pressing plate 135 may be disposed between the pressing member 130 and the magnetic plate 150 as shown in FIG. 6(b).

Further, a pressing-plate-integrated type pressing member 140 can be also used, that is formed by one or a plurality of pressing members 130 being fixed to the pressing plate 135 (in the mode shown in the figure, a plurality of pressing members 130 are fixed to the pressing plate 135). For example, according to the pressing-plate-integrated type pressing member 140 formed by a plurality of pressing members 130 being fixed to the pressing plate 135, a plurality of pressing members 130 can be disposed on the vapor deposition target 200 by one operation, and enhancement in productivity can be achieved more than when the plurality of pressing members 130 are individually disposed on the vapor deposition target 200. Further, when a plurality of pressing members 130 are individually disposed on the vapor deposition target 200, the respective pressing members 130 tend to deviate from the disposed positions when the pressing plate 135 or the magnetic plate 150 is disposed on the plurality of pressing members 130 thereafter. On the other hand, according to the pressing-plate-integrated type pressing member 140, the respective pressing members 130 are integrated with the pressing plate 135, and therefore, the pressing-plate-integrated type pressing member 140 has an advantage that the pressing members 130 are more difficult to deviate than in the case of the plurality of pressing members 130 being individually disposed.

Although it depends on the thickness of the pressing member 130, the pressing plate 135 hardly contacts the vapor deposition target 200 directly when the pressing plate 135 is disposed between the pressing member 130 and the magnetic plate 150, or the pressing-plate-integrated type pressing member 140 is disposed between the vapor deposition target 200 and the magnetic plate 150, and even when the pressing plate 135 and the vapor deposition target 200 are in contact with each other, the strength with which the pressing plate 135 itself presses the vapor deposition target 200 to the vapor deposition mask 100 side is weak. That is, the pressing plate 135 does not directly act on pressing the vapor deposition target by the pressing member 130, or a degree of the action is small. Accordingly, the material of the pressing plate 135 is not specially limited, but is preferably a material that does not hinder the magnetic force of the magnetic plate 150. For example, the pressing plate is preferably formed from a nonmagnetic material. As the nonmagnetic material, aluminum, carbon, glass and the like can be cited.

Especially when the pressing plate 135 formed from a material with high heat conductivity such as an aluminum is adopted, at the time of vapor deposition using the method for forming a vapor deposition pattern of an embodiment, the pressing plate 135 plays a role as a cleaning plate that lets heat exerted on the vapor deposition mask 100 escape, in other words, cools the vapor deposition mask, and can restrain the vapor deposition mask 100 from expanding or the like by the heat at the time of vapor deposition.

The thickness of the pressing plate 135 is not specially limited, but is about 1 mm to about 30 mm, as an example. As the pressing member 130 which is fixed to the pressing plate 135, what is described above can be properly selected and used, and detailed explanation here is omitted.

Hereafter, a preferable mode of the pressing member 130 is explained by citing the vapor deposition mask 100 which is used in the method for forming a vapor deposition pattern of an embodiment as an example.

(Example of Vapor Deposition Mask for Use in Method for Forming Vapor Deposition Pattern of Embodiment)

The vapor deposition mask (hereafter, referred to as the vapor deposition mask of an embodiment) as an example for use in the method for forming a vapor deposition pattern of an embodiment adopts a structure formed by stacking the metal mask 10 in which the slits 15 are formed and the resin mask 20 in which the openings 25 corresponding to the pattern to be produced by vapor deposition are formed in the positions overlapping the slits, as shown in FIG. 7.

"Resin Mask"

Figure 7A:
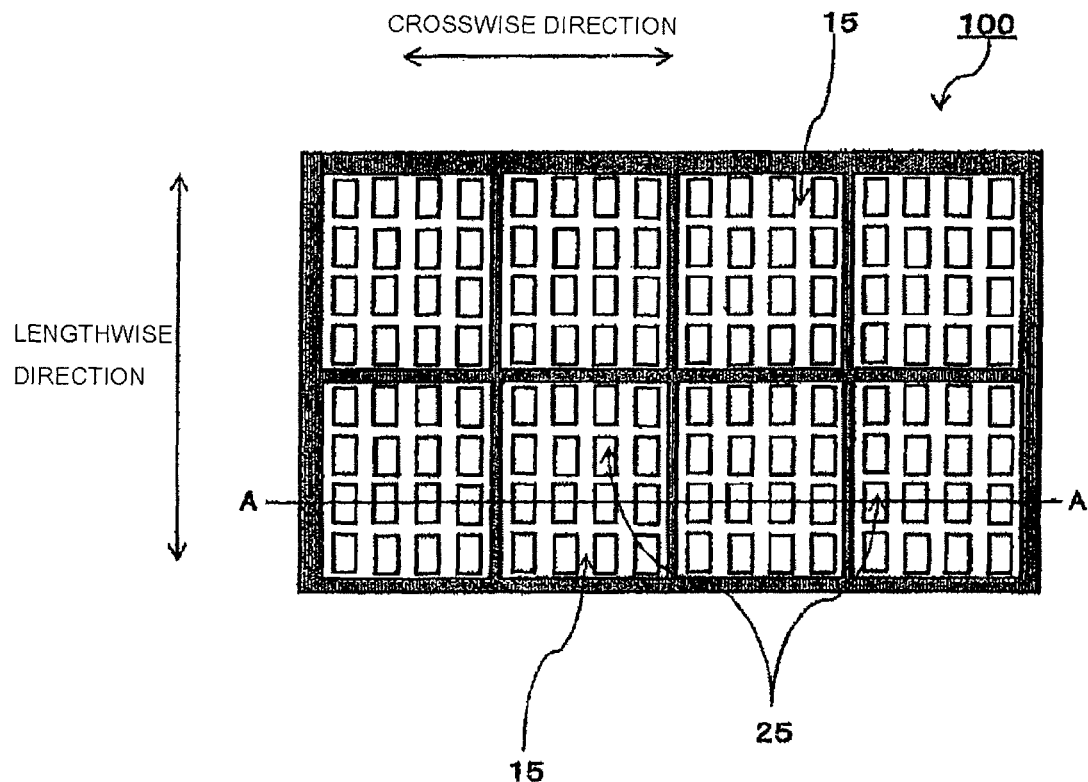
FIGS. 7(a) and 7(b) are views showing an example of the vapor deposition mask for use in formation of a vapor deposition pattern of an embodiment.
Figure 7B:
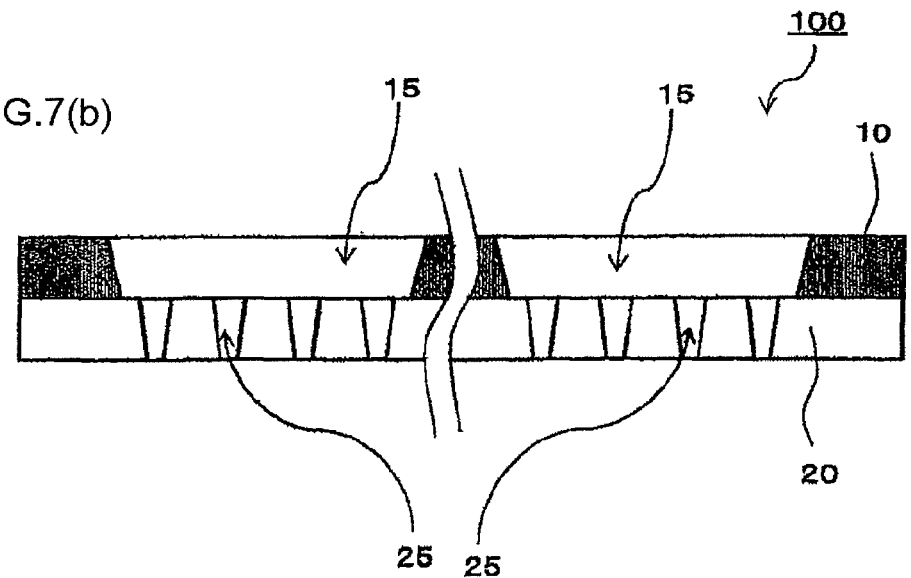

As shown in FIG. 7, a plurality of openings 25 are provided in the resin mask 20. FIG. 7(a) is an elevation view of the vapor deposition mask for use in the method for producing a frame-equipped vapor deposition mask of an embodiment as seen in plan view from the metal mask side, and FIG. 7(b) is a schematic cross-sectional view taken along the line A-A in FIG. 7(a).

While in the mode shown in the figure, the opening shape of the opening 25 exhibits a rectangular shape, the opening shape is not specially limited, and may be any shape as long as it is the shape corresponding to the pattern to be produced by vapor deposition. For example, the opening shape of the opening 25 may be rhombic or polygonal or may be a shape having a curvature such as a circle and an ellipsoid. Note that it can be said that the rectangular or polygonal opening shape is a preferable opening shape of the opening 25 in a point that a large area of light emission can be taken as compared with the opening shape having a curvature such as a circle and an ellipsoid.

The material of the resin mask 20 is not limited, but, for example, a material that enables formation of the opening 25 with high definition by laser processing or the like, has a low rate of dimensional change and a low rate of humidity absorption under heat and with passage of time, and is light weight, is preferably used. As such materials, a polyimide resin, a polyamide resin, a polyamide-imide resin, a polyester resin, a polyethylene resin, a polyvinylalcohol resin, a polypropylene resin, a polycarbonate resin, a polystyrene resin, a polyacrylonitrile resin, an ethylene-vinyl acetate copolymer resin, an ethylene-vinylalcohol copolymer resin, an ethylene-methacrylic acid copolymer resin, a polyvinyl chloride resin, a polyvinylidene chloride resin, cellophane, an ionomer resin and the like can be cited. Among the materials shown above by way of example, the resin materials with the thermal expansion coefficients of about 16 ppm/°C. or less are preferable, the resin materials with the rates of humidity absorption of about 1.0% or less are preferable, and the resin materials including both the conditions are particularly preferable. By adopting the resin mask using these resin materials, dimensional precision of the openings 25 can be improved, and a rate of dimensional change and a rate of humidity absorption under heat and with passage of time can be reduced.

The thickness of the resin mask 20 is not specially limited, but, in the case of further improving the effect of suppressing generation of a shadow, the thickness of the resin mask 20 is preferably about 25 µm or less, more preferably less than about 10 µm. A preferable range of the lower limit value is not specially limited, but, in the case where the thickness of the resin mask 20 is less than about 3 µm, defects such as a pinhole tend to arise and a risk of deformation or the like increases. In particular, by setting the thickness of the resin mask 20 to be about 3 µm or more and less than about 10 µm, more preferably about 4 µm or more and about 8 µm or less, the influence of a shadow in formation of a high-definition pattern exceeding 400 ppi can be more effectively prevented. Further, while the resin mask 20 may be directly bonded to the metal mask 10 described later or may be bonded thereto via an adhesive layer, in the case where the resin mask 20 is bonded to the metal mask 10 via the adhesive layer, the total thickness of the resin mask 20 and the adhesive layer is preferably within the aforementioned preferable thickness range. Note that the shadow is a phenomenon that a part of a vapor deposition material released from a vapor deposition source collides with inner wall surfaces of the slit of the metal mask and the opening of the resin mask and does not reach the vapor deposition target, and thereby, a portion without vapor deposition that has a film thickness smaller than the intended vapor deposition film thickness arises.

The sectional shape of the opening 25 is not specially limited, and end surfaces that face each other and are of the resin mask forming the opening 25 may be substantially parallel to each other, but as shown in FIG. 7(b), the sectional shape of the opening 25 is preferably the shape having broadening toward a vapor deposition source. In other words, it preferably has a taper surface having broadening toward the metal mask 10 side. While a taper angle can be properly set with the thickness or the like of the resin mask 20 taken into consideration, an angle formed by a straight line connecting a lower bottom distal end in the opening of the resin mask and an upper bottom distal end in the opening of the same resin mask and the bottom surface of the resin mask, in other words, an angle formed by an inner wall surface of the opening 25 and a surface of the resin mask 20 on the side that is not in contact with the metal mask 10 (an undersurface of the resin mask in the mode shown in the figure) in the cross section in the thickness direction of the inner wall surface constituting the opening 25 of the resin mask 20 is preferably within a range of about 50 to about 850, more preferably within a range of about 15° to about 75°, further more preferably within a range of about 250 to about 650. In particular, within this range, it is preferably an angle smaller than a vapor deposition angle of a vapor deposition machine to be used. Moreover, in the mode shown in the figure, while an end surface that forms the opening 25 exhibits a linear shape, it is not limited thereto but may be in a curved shape convex outward, in other words, a shape of the entire opening 25 may be a bowl shape.

"Metal Mask"

As shown in FIG. 7(b), the metal mask 10 is stacked on one surface of the resin mask 20. The metal mask 10 is formed from a metal, in which the slits 15 extending in the lengthwise direction or the crosswise direction are disposed. The slit 15 is synonymous with an opening. An arrangement example of the slits is not specially limited, and the slits extending in the lengthwise direction and the crosswise direction may be arranged in a plurality of rows in the lengthwise direction and the crosswise direction, the slits extending in the lengthwise direction may be arranged in a plurality of rows in the crosswise direction, or the slits extending in the crosswise direction may be arranged in a plurality of rows in the lengthwise direction. Further, they may be arranged in only one row in the lengthwise direction or the crosswise direction. Note that "lengthwise direction" and "crosswise direction" mentioned in the specification of the present application indicate the vertical direction and the horizontal direction in the drawings, respectively, and may be any directions of the longitudinal direction and the width direction of the vapor deposition mask, the resin mask and the metal mask. For example, the longitudinal direction of the vapor deposition mask, the resin mask and the metal mask may be set to be the "lengthwise direction", or the width direction thereof may be set to be the "lengthwise direction". Moreover, while in the specification of the present application, the case where the shape of the vapor deposition mask as seen in plan view is a rectangular shape is described as an example, it may be another shape such, for example, as a circular shape and a polygonal shape such as a rhombic shape. In this case, a longitudinal direction of a diagonal line, a radial direction, or any direction only has to be set as the "longitudinal direction", and the direction perpendicular to the "longitudinal direction" is set as the "width direction (sometimes referred to as a short-side direction)".

The material of the metal mask 10 is not specially limited, but a conventionally known one in the field of the vapor deposition mask can be properly selected and used, and, for example, a metal material such as stainless steel, an iron-nickel alloy and an aluminum alloy can be cited. Above all, an invar material which is an iron-nickel alloy can be preferably used since an invar material is hardly deformed by heat.

While the thickness of the metal mask 10 is not specially limited, in order to more effectively prevent generation of a shadow, it is preferably about 100 m or less, more preferably about 50 µm or less, and particularly preferably about 35 µm or less. Note that, in the case of being thinner than about 5 µm, risks of rupture and deformation tend to increase and handling tends to become difficult.

Further, while in the mode shown in FIG. 7(a), the shape of the opening of the slit 15 as seen in plan view exhibits a rectangular shape, the opening shape is not specially limited, but the opening shape of the slit 15 may be any shape such as a trapezoid and a circle.

The sectional shape of the slit 15 formed in the metal mask 10 is not specially limited, but is preferably a shape having broadening toward the vapor deposition source as shown in FIG. 7(*b*). More specifically, an angle formed by a straight line connecting the lower bottom distal end in the slit 15 of the metal mask 10 and the upper bottom distal end in the slit 15 of the same metal mask 10, and the bottom surface of the metal mask 10, in other words, an angle formed by the inner wall surface of the slit 15 and the surface of the metal mask 10 on the side in contact with the resin mask 20 (the undersurface of the metal mask in the mode shown in the figure) in the cross section in the thickness direction of the inner wall surface constituting the slit 15 of the metal mask 10 is preferably within a range of about 5° to about 85°, more preferably within a range of about 15° to about 800, further more preferably within a range of about 250 to about 650. In particular, within this range, it is preferably an angle smaller than a vapor deposition angle of a vapor deposition machine to be used.

A method of stacking the metal mask 10 on the resin mask 20 is not specially limited, but the metal mask 10 may be pasted on the resin mask 20 using various adhesive agents, or the resin mask that has self-adhesion may be used. The dimensions of the resin mask 20 and the metal mask 10 may be the same or may be different dimensions. Note that with fixation to a frame which is arbitrarily performed afterward taken into consideration, the dimension of the resin mask 20 is preferably made smaller than that of the metal mask 10 to set the outer peripheral portion of the metal mask 10 to be in an exposed state, which facilitates fixing of the metal mask 10 to the frame.

The metal mask 10 may be formed by processing a metal plate, or may be formed by using a plating method or the like. Further, the metal mask 10 may be formed by the methods other than these methods.

Figure 8:
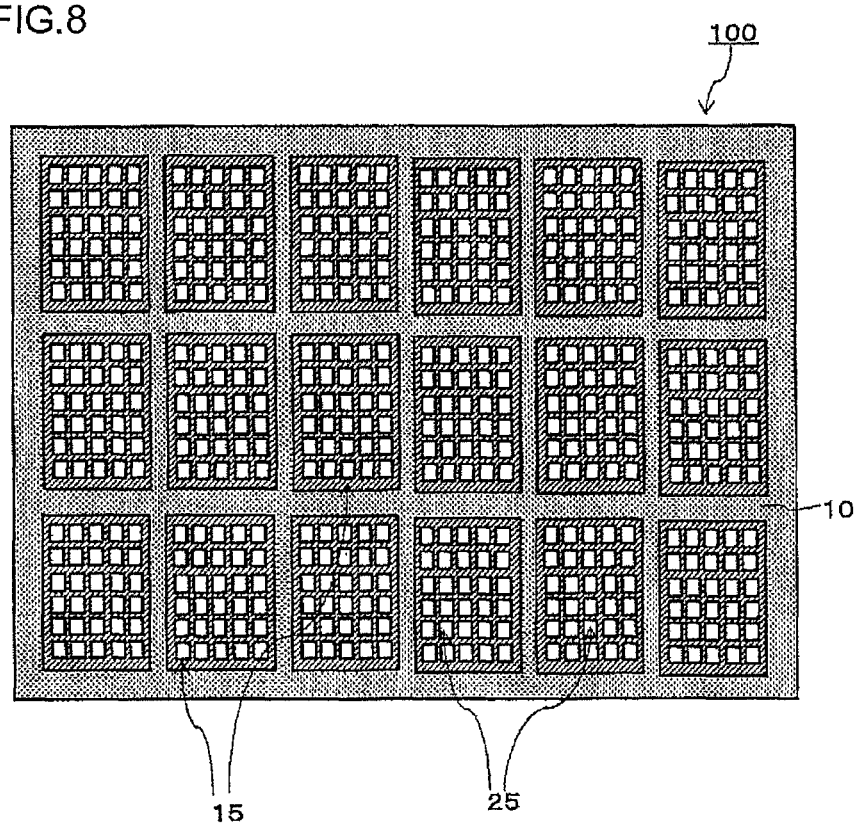
FIG. 8 is an elevation view of a vapor deposition mask of an example for use in formation of a vapor deposition pattern of an embodiment as seen in plan view from a metal mask side.

Next, dimensions of gaps that can be generated between the vapor deposition mask 100 and the vapor deposition target 200 when in the close contact step, a vapor deposition mask shown in FIG. 8 is disposed on one surface of the vapor deposition target 200, the magnetic plate 150 is disposed on the other surface of the vapor deposition target 200, and the vapor deposition mask 100 and the vapor deposition target 200 are brought into close contact with each other by using the magnetism of the magnetic plate 150 are described with a preferable mode of the pressing member 130.

The vapor deposition mask shown in FIG. 8 is provided with a plurality of slits 15 ("18" slits) in the metal mask 10, and a plurality of openings 25 that are provided in the resin mask 20 are demarcated by the plurality of slits 15. Note that FIG. 8 is an elevation view of the vapor deposition mask 100 as seen in plan view from the metal mask side.

Figure 9:
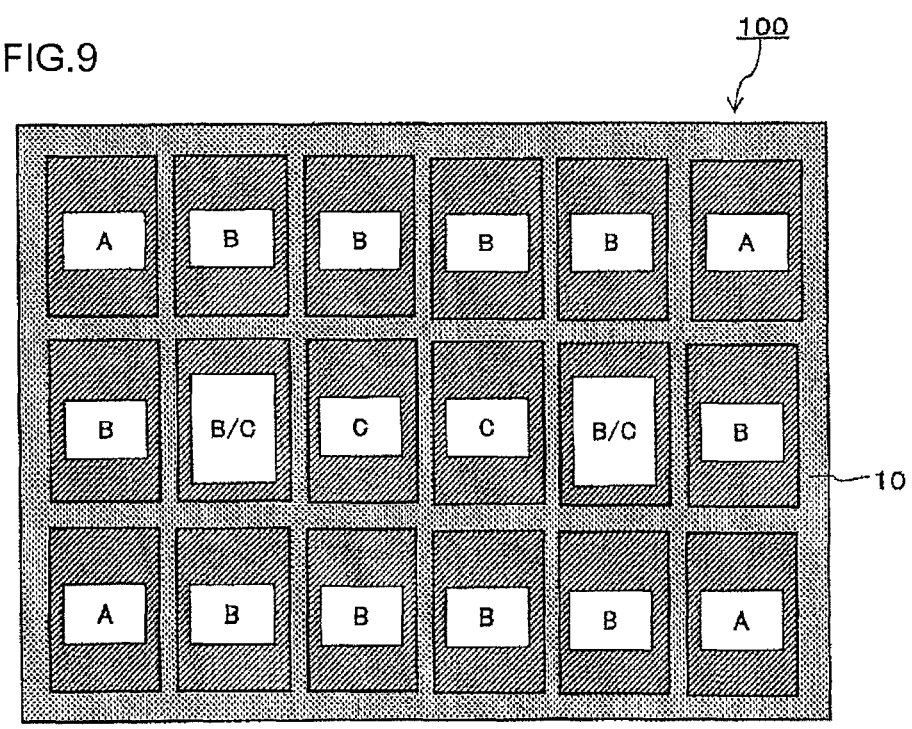
FIG. 9 is a view showing a state in which dimensions of gaps are divided into levels.

When attention is paid to gaps that can be generated between the vapor deposition mask 100 and the vapor deposition target 200 when the vapor deposition mask shown in FIG. 8 is used, the dimensions of the gaps generated between the vapor deposition mask 100 and the vapor deposition target 200 become larger toward an inner side from an outer periphery of the vapor deposition mask 100, in other words, toward an inner side from an outer periphery of the vapor deposition target 200, and in particular, the tendency becomes larger as the vapor deposition mask 100 is upsized. In short, the gaps tend to be large in a vicinity of a vapor deposition mask center at the time of the vapor deposition mask 100 being seen in plan view. This is considered to be due to the self weight of the vapor deposition mask 100. FIG. 9 is a view showing a state of the vapor deposition mask shown in FIG. 8 seen in plan view from the metal mask 10 side, and the dimensions of the gaps that can be generated between the vapor deposition mask 100 and the vapor deposition target 200 are divided into levels of "A", "B" and "C" for each region overlapping each of the slits 15. Note that the dimensions of the gaps are increasing in the order of "A", "B" and "C".

Figure 10A:
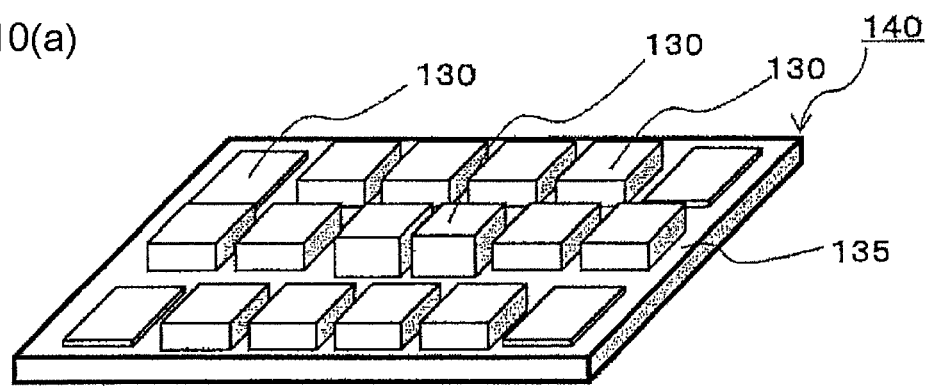
FIGS. 10(a) and 10(b) are perspective views showing examples of a pressing-plate-integrated type pressing member.
Figure 10B:
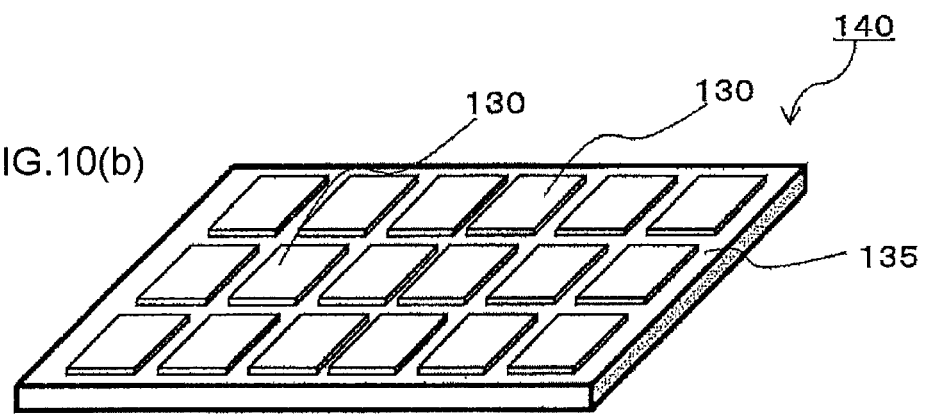

In disposing the pressing member 130 between the vapor deposition target 200 and the magnetic plate 150, it is preferable to properly dispose the pressing members 130 having different thicknesses ("a mode A of the preferable pressing member") with the dimensions of the gaps that can be generated between the vapor deposition mask 100 and the vapor deposition target 200 taken into consideration. To be specific, as shown in FIG. 10(*a*), it is preferable to dispose the pressing members 130 having larger thicknesses toward the inner side from the outer periphery of the vapor deposition target 200. More specifically, it is preferable to dispose the pressing members 130 having large thicknesses on regions corresponding to the aforementioned "C", and dispose the pressing members 130 having smaller thicknesses continuously or non-continuously on "B" and "A". Note that the thickness of the pressing member 130 mentioned here means a height from the bottom surface of the pressing member 130 to an apex or a top surface of the pressing member that is located in the farthest position from the bottom surface. FIG. 10(*a*) is a perspective view showing an example of the pressing-plate-integrated type pressing member 140, a plurality of pressing members 130 having different thicknesses are fixed onto the pressing plate 135 so that the pressing members having larger thicknesses are located toward an inner side from an outer periphery thereof.

Note that the above is an example of a case where a plurality of pressing members 130 with the thicknesses made to differ are disposed, and the plurality of pressing members 130 with the thicknesses made to differ can be properly disposed in accordance with the dimensions or the like of the gaps. For example, the pressing members having small thicknesses may be disposed toward the inner side from the outer periphery of the vapor deposition target 200, or a plurality of pressing members 130 having different thicknesses may be disposed at random. Further, as shown in FIG. 10(*b*), the thicknesses of the plurality of pressing members may be fixed.

Figure 12:
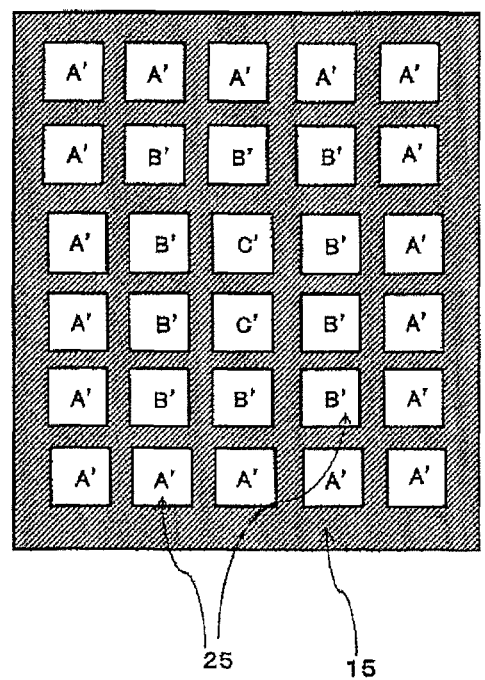
FIG. 12 is a partial enlarged view showing a state in which dimensions of gaps in a region demarcated by a slit are divided into levels.

FIG. 12 is a partial schematic view of the dimensions of the gaps generated between the vapor deposition mask 100 and the vapor deposition target 200 in the positions overlapping the demarcated regions in the thickness direction being divided into levels of "A'", "B'" and "C'", with attention paid to one of the regions demarcated by the slits. Note that the dimensions of the gaps are increasing in the order of "A'", "B'" and "C'". As shown in the drawing, in the region demarcated by the slit 15, the dimensions of the gaps generated between the vapor deposition mask 100 and the vapor deposition target tend to be smaller as they are closer to the metal portion of the metal mask 10, and to be larger as they are away from the metal portion. Specifically, the vapor deposition mask 100 and the magnetic plate 150 attract each other in the metal portion that are slit non-formation regions of the metal mask 10, so that a gap is not generated or a gap is small between the vapor deposition mask 100 and the vapor deposition target 200 in the vicinity of the metal portion where the vapor deposition mask 100 and the magnetic plate 150 directly attract each other, and the gaps tend to be larger as they are away from the metal portion where the vapor deposition mask 100 and the magnetic plate 150 directly attract each other.

Figure 13:
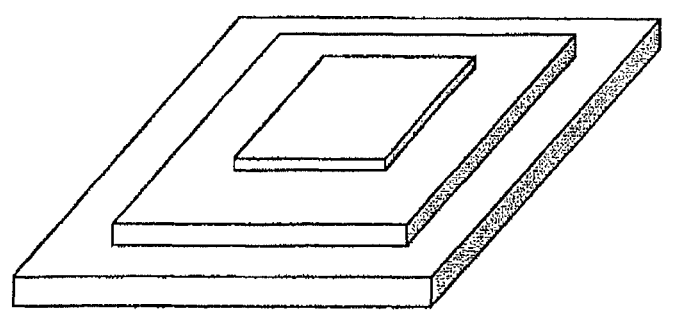
FIG. 13 is a perspective view showing an example of the pressing member.

Accordingly, in the case of disposing the pressing member 130 in each of the regions demarcated by the slits, it is preferable to use the pressing member 130 ("a mode B of the preferable pressing member") in which the thickness is continuously or non-continuously changing toward the inner side from the outer periphery, with the dimensions of the gaps in the demarcated regions taken into consideration. To be specific, as shown in FIG. 13, it is preferable to use the pressing member 130 in which the thickness becomes larger continuously or non-continuously toward the inner side from the outer periphery. As the pressing member in which the thickness is continuously changing, the pressing member described above in which the shape on the side in contact with the vapor deposition target 200 is an R shape, in other words, the shape on the side in contact is a shape having a curvature can be cited. Further, as the pressing member in which the thickness is changing non-continuously, the pressing member in which the thickness is changing stepwise can be cited, as shown in FIG. 13.

Figure 11A:
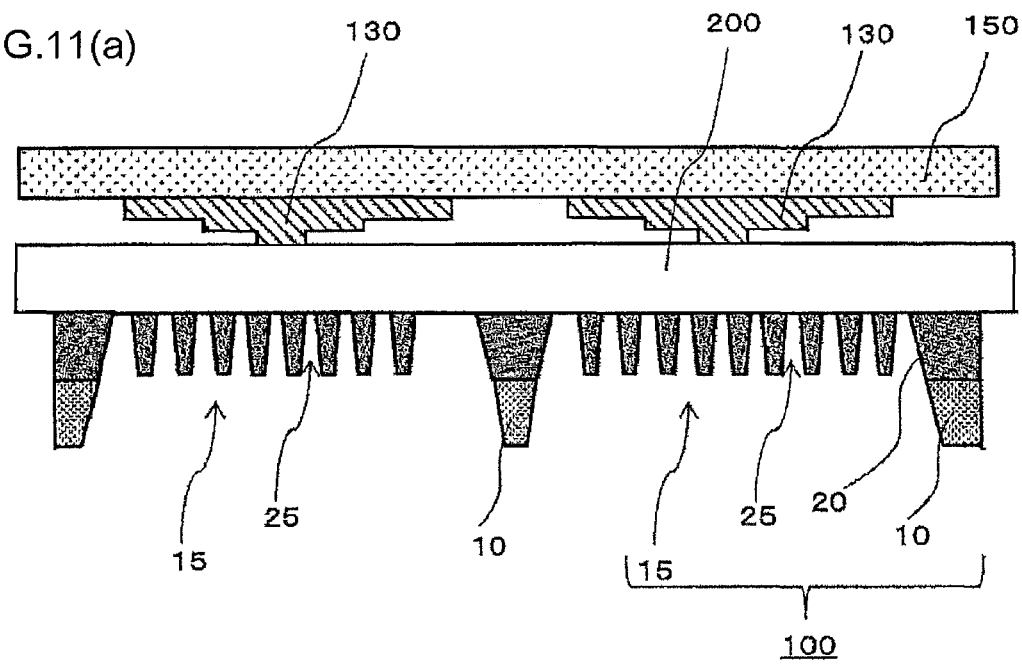
FIG. 11(a) is a schematic cross-sectional view showing a state before bringing the vapor deposition mask and the vapor deposition target into close contact with each other.
Figure 11B:
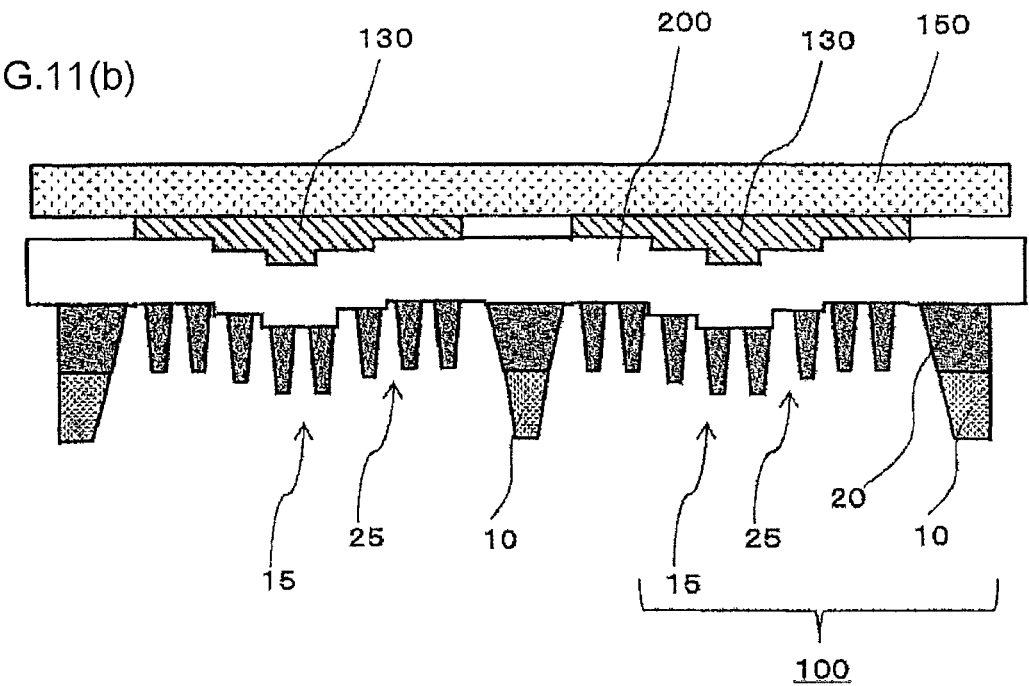
FIG. 11(b) is a schematic cross-sectional view showing a state at a time of the vapor deposition mask and the vapor deposition target being brought into close contact with each other.

FIG. 11(a) is a schematic cross-sectional view showing a state before the vapor deposition mask 100 and the magnetic plate 150 attract each other, and FIG. 11(b) is a schematic cross-sectional view showing a state at a time of the vapor deposition mask 100 and the vapor deposition target 200 being brought into close contact with each other. In a mode shown in the drawings, the pressing member 130 (the pressing member 130 in which the thickness is changing non-continuously in the mode shown in FIG. 13) in which the thickness is changing continuously or non-continuously toward an inner side from an outer periphery is disposed between the vapor deposition target 200 and the magnetic plate 150. As shown in FIG. 11(b), by using the pressing member 130 in which the thickness is changing continuously or non-continuously toward the inner side from the outer periphery, a pressing amount on the vapor deposition target which is pressed by the pressing member 130 can be changed when the vapor deposition mask 100 and the magnetic plate 150 attract each other. To be specific, in the region where the gap tends to be generated to be large, the pressing amount on the vapor deposition target is increased, whereas in the region where the gap that can be generated is small, the pressing amount on the vapor deposition target is decreased. That is, by changing the pressing amount in response to the dimension of the gap, the vapor deposition mask 100 and the vapor deposition target 200 can be sufficiently brought into contact with each other. This similarly applies to the case of the aforementioned "mode A of the preferable pressing member".

Note that the pressing member 130 of the aforementioned preferable mode is an example of a case of disposing the pressing member 130 in the position overlapping the region demarcated by the slit 15 when the dimensions of the gaps are changing as shown in FIG. 12 in the region demarcated by the slit 15, and the pressing member 130 in which the thickness is changing continuously or non-continuously can be properly disposed in the position overlapping the region demarcated by the slit 15, with the dimensions of the gaps in the region demarcated by the slit 15 taken into consideration. For example, the pressing member in which the thickness is decreasing continuously or non-continuously toward the inner side from the outer periphery of the vapor deposition target 200 may be disposed, or the pressing member 130 in which the thickness changes at random may be disposed.

"the mode A of the preferable pressing member" and "the mode B of the preferable pressing member" which are described above can be combined. Note that in FIG. 10, the pressing-plate-integrated type pressing member 140 is adopted, but when a part of the surface of the pressing member 130 and the magnetic plate 150 overlap each other in the thickness direction, the pressing members 130 may be individually disposed in the position overlapping the regions demarcated by the slits 15 in the thickness direction without using the pressing plate 135.

Further, in the mode shown in the figure, the single pressing member 130 is disposed in each of the positions overlapping the regions demarcated by the slits 15 in the thickness direction, but a plurality of pressing members 130 may be disposed in the position overlapping the region demarcated by the slit 15 in the thickness direction (not shown in the figure). Further, as described above, when adhesion of the vapor deposition mask 100 and the vapor deposition target 200 is sufficient in the portion near the metal portion in the region demarcated by the slit 15, it is not necessary to dispose the pressing member in the position overlapping the entire region demarcated by the slit 15, but the pressing member 130 may be disposed in the position overlapping the spot where the gap can be generated in the thickness direction, in the region demarcated by the slit 15. As an example, it is preferable to use the pressing member 130 in which a side length of the pressing member as seen in plan view is about 50% or more of each side length of the demarcated region, preferably about 70% or more, and dispose the pressing member 130 so that a center of the pressing member as seen in plan view overlaps the center of the region demarcated by the slit.

Hereafter, a mode of the preferable vapor deposition mask for use in the method for forming a vapor deposition pattern of an embodiment is described by citing Embodiment (A) and Embodiment (B) as examples.

<Vapor Deposition Mask of Embodiment (A)>

Figure 14:
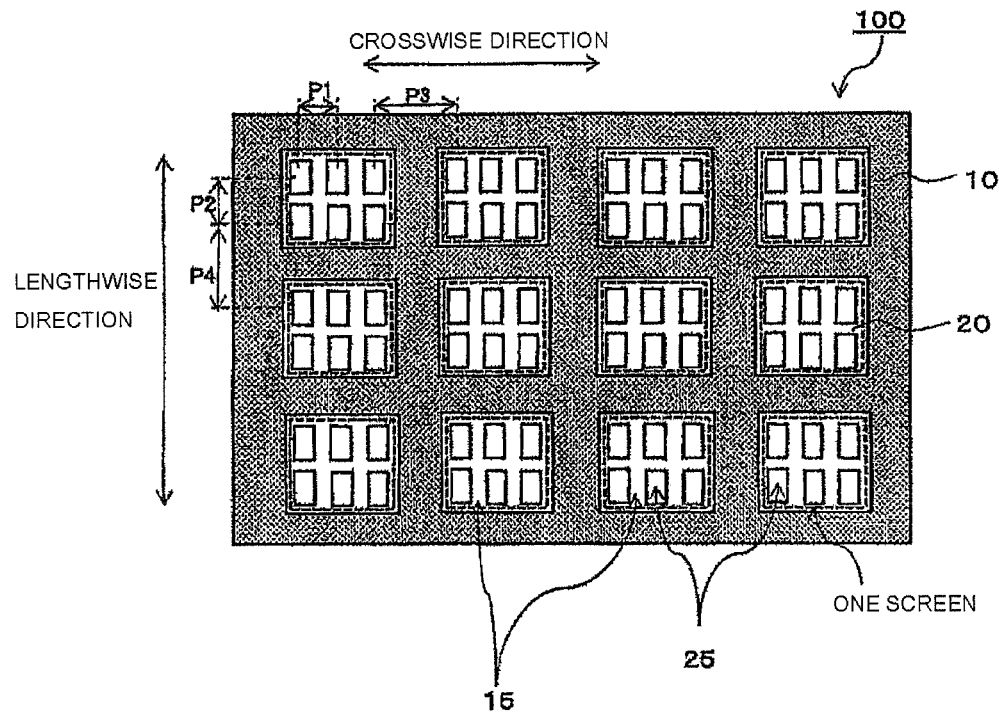
FIG. 14 is an elevation view of a vapor deposition mask in embodiment (A) as seen in plan view from a metal mask side.
Figure 15:
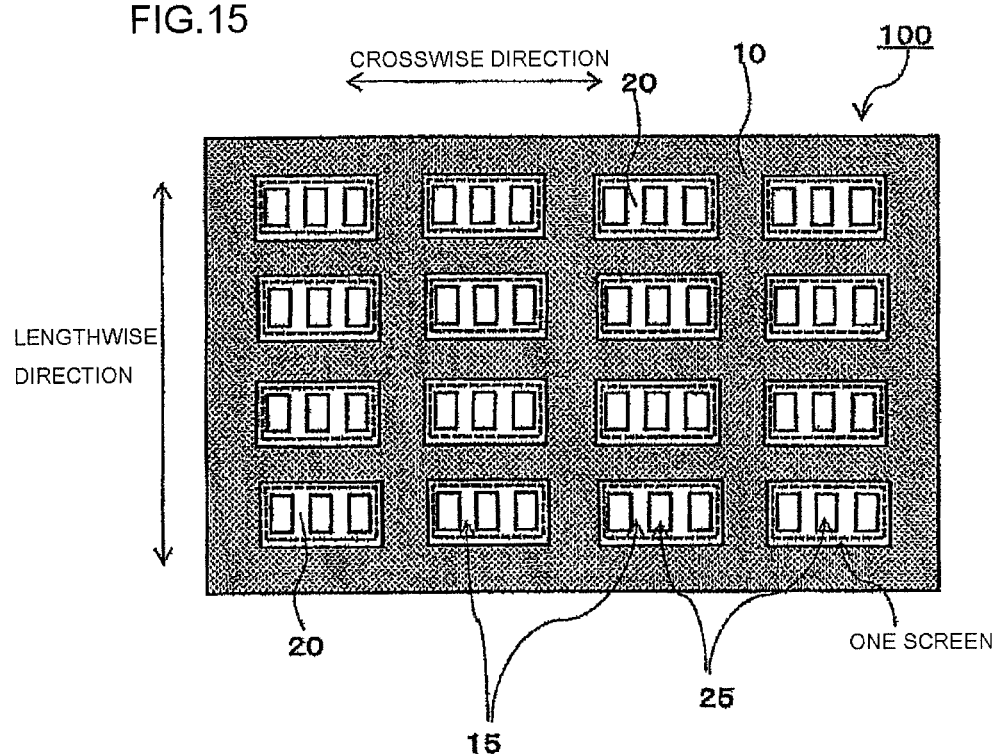
FIG. 15 is an elevation view of the vapor deposition mask in embodiment (A) as seen in plan view from the metal mask side.
Figure 16:
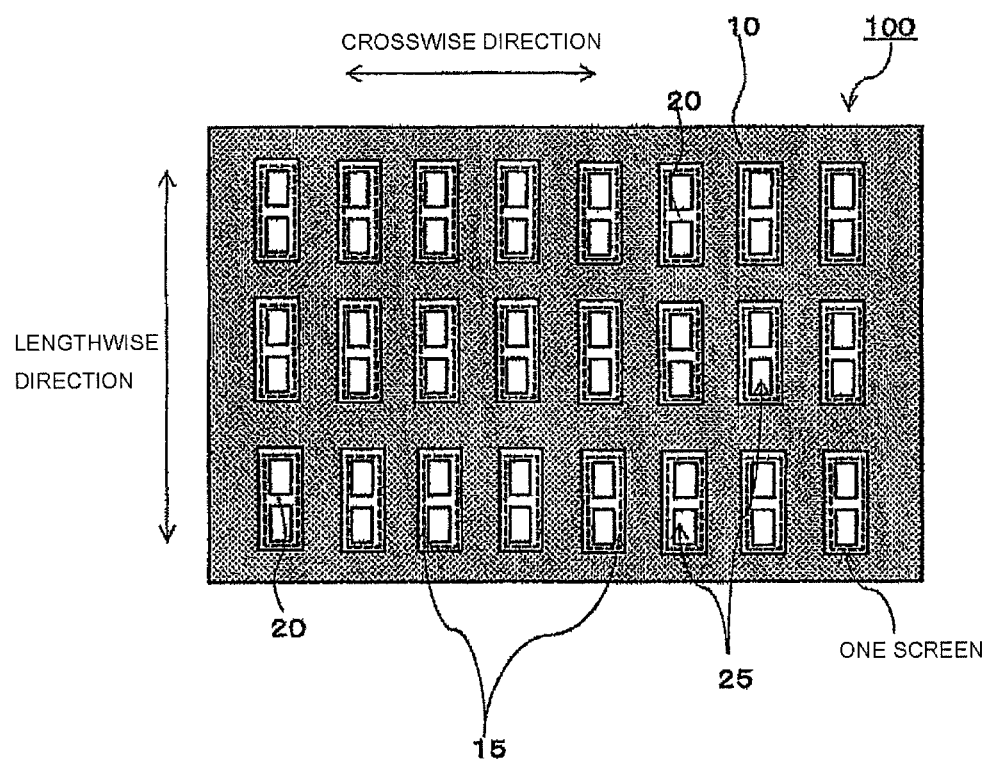
FIG. 16 is an elevation view of the vapor deposition mask in embodiment (A) as seen in plan view from the metal mask side.

As shown in FIG. 14, the vapor deposition mask 100 of Embodiment (A) is a vapor deposition mask for simultaneously forming vapor deposition patterns for a plurality of screens and it is characterized in that the vapor deposition mask 100 is formed by stacking the metal mask 10 provided with a plurality of slits 15 on one surface of the resin mask 20, wherein the resin mask 20 is provided with the openings 25 necessary to constitute a plurality of screens, and each of the slits 15 is provided in a position overlapping at least one entire screen.

The vapor deposition mask 100 of Embodiment (A) is a vapor deposition mask used for simultaneously forming vapor deposition patterns for a plurality of screens, and one vapor deposition mask 100 can simultaneously form vapor deposition patterns corresponding to a plurality of products. "Openings" stated for the vapor deposition mask of Embodiment (A) mean patterns to be produced using the vapor deposition mask 100 of Embodiment (A), and for example, when the vapor deposition mask is used for forming an organic layer in an organic EL display, the shape of the openings 25 is a shape of the organic layer. Moreover, "one screen" is constituted of an aggregate of the openings 25 corresponding to one product, and when the one product is an organic EL display, an aggregate of organic layers needed for forming one organic EL display, in other words, an aggregate of the openings 25 to be the organic layers is "one screen". Further, in the vapor deposition mask 100 of Embodiment (A), in order to simultaneously form the vapor deposition patterns for the plurality of screens, the aforementioned "one screen" is arranged for each of the plurality of screens in the resin mask 20 at a predetermined interval. Namely, in the resin mask 20, the openings 25 needed to constitute the plurality of screens are provided.

The vapor deposition mask of Embodiment (A) is characterized in that the metal mask 10 which is provided with the plurality of slits 15 is provided on one surface of the resin mask, and each of the slits is provided in the position overlapping at least the one entire screen. In other words, it is characterized in that between the openings 25 needed to constitute one screen, metal line portions which have the same length as the length of the slit 15 in the lengthwise direction and have the same thickness as that of the metal mask 10 do not exist between the openings 25 adjacent in the crosswise direction, or metal line portions which have the same length as the length of the slit 15 in the crosswise direction and have the same thickness as that of the metal mask 10 do not exist between the openings 25 adjacent in the lengthwise direction. Hereafter, the metal line portions which have the same length as the length of the slit 15 in the lengthwise direction and have the same thickness as that of the metal mask 10, and the metal line portions which have the same length as the length of the slit 15 in the crosswise direction and have the same thickness as that of the metal mask 10 are sometimes collectively referred to simply as metal line portions.

According to the vapor deposition mask 100 of Embodiment (A), even when the dimension of the openings 25 needed to constitute one screen and the pitch between the openings 25 constituting one screen are made small, for example, even when the dimension of the openings 25 and the pitch between the openings 25 are made extremely small in order to form a screen exceeding 400 ppi, for example, interference by metal line portions can be prevented, and an image with high definition can be formed. Note that when one screen is divided by a plurality of slits, in other words, when the metal line portions having the same thickness as that of the metal mask 10 exist between the openings 25 constituting one screen, as the pitch between the openings 25 constituting one screen is smaller, the metal line portions existing between the openings 25 more become a hindrance in forming the vapor deposition pattern on the vapor deposition target and it becomes more difficult to form the vapor deposition pattern with high definition. In other words, when the metal line portions having the same thickness as that of the metal mask 10 exist between the openings 25 constituting one screen, the metal line portions in the case of setting the frame-equipped vapor deposition mask cause generation of a shadow, and it becomes difficult to form a screen with high definition.

Next, referring to FIG. 14 to FIG. 17, an example of the openings 25 constituting one screen is described. Note that a region enclosed by a broken line in the modes shown in the figures is one screen. While in the modes shown in the figures, an aggregate of a small number of openings 25 is one screen for convenience of explanation, the mode of the openings 25 is not limited to these modes, and, for example, the openings 25 for millions of pixels may be present in one screen, where one opening 25 is one pixel.

In the mode shown in FIG. 14, one screen is constituted of an aggregate of openings 25 having a plurality of openings 25 provided in the lengthwise direction and the crosswise direction. In the mode shown in FIG. 15, one screen is constituted of an aggregate of the openings 25 having a plurality of openings 25 provided in the crosswise direction. Moreover, in the mode shown in FIG. 16, one screen is constituted of an aggregate of the openings 25 having a plurality of openings 25 provided in the lengthwise direction. Further, in FIG. 14 to FIG. 16, the slit 15 is provided in a position overlapping one entire screen.

Figure 17A:
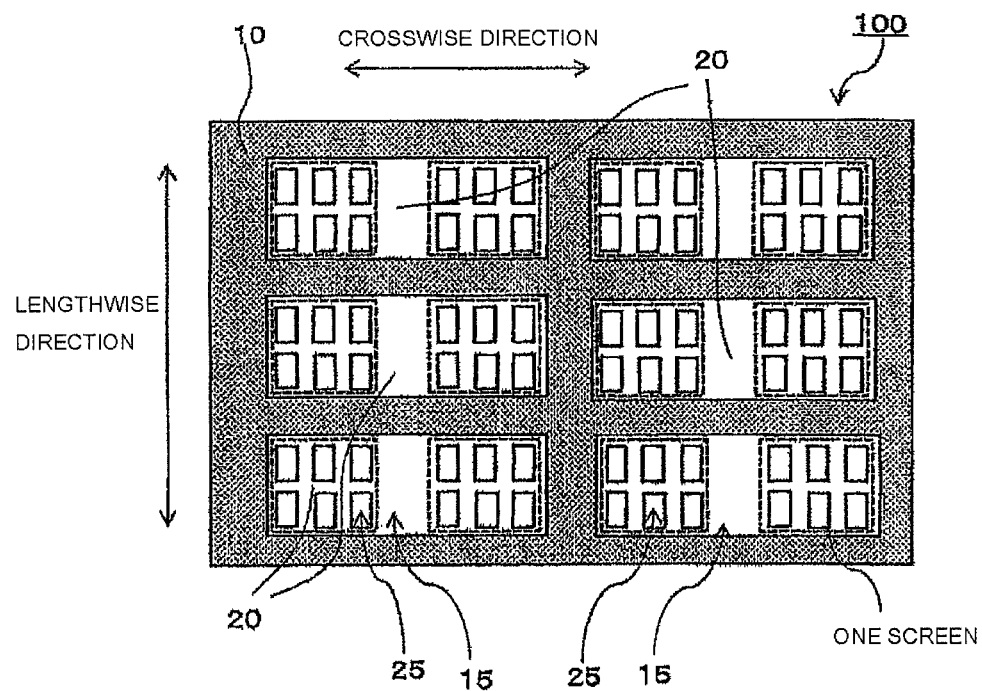
FIGS. 17(a) and 17(b) are both elevation views of the vapor deposition mask in embodiment (A) as seen in plan view from the metal mask side.
Figure 17B:
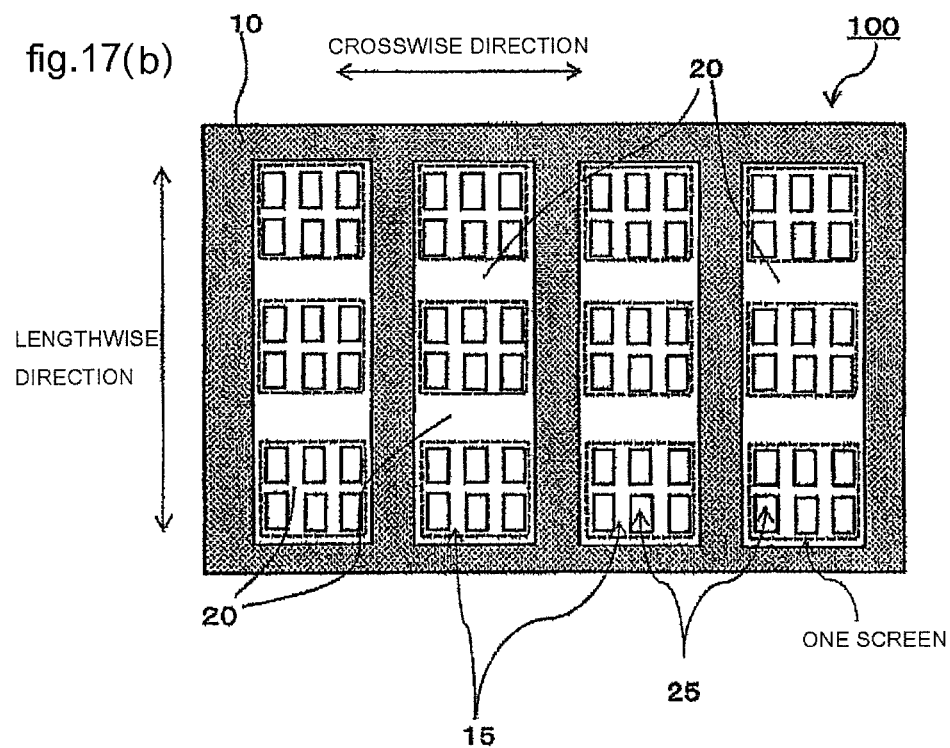

As described above, the slit 15 may be provided in the position overlapping only one screen, or as shown in FIGS. 17(a) and 17(b), may be provided in a position overlapping entirety of two or more screens. In FIG. 17(a), in the vapor deposition mask 100 shown in FIG. 14, the slit 15 is provided in a position overlapping the entirety of two screens continuous in the crosswise direction. In FIG. 17(b), the slit 15 is provided in a position overlapping entirety of three screens continuous in the lengthwise direction.

Next, by citing the mode shown in FIG. 14 as an example, pitches among the openings 25 constituting one screen and pitches among the screens are described. The pitches among the openings 25 constituting one screen and the dimension of the opening 25 are not specially limited, but can be properly set in accordance with a pattern to be produced by vapor deposition. For example, when formation of the vapor deposition pattern with high definition of 400 ppi is performed, a pitch (P1) in the crosswise direction and a pitch (P2) in the lengthwise direction between the adjacent openings 25 in the openings 25 constituting one screen are about 60 μm. Further, the dimension of the opening is about 500 μm² to about 1000 μm². Moreover, one opening 25 is not limited to corresponding to one pixel, but, for example, a plurality of pixels can be also combined to one opening 25 depending on a pixel arrangement.

While a pitch (P3) in the crosswise direction and a pitch (P4) in the lengthwise direction between the screens are not specially limited, but, as shown in FIG. 14, when one slit 15 is provided in the position overlapping one entire screen, metal line portions are present between the respective screens. Accordingly, when the pitch (P4) in the lengthwise direction and the pitch (P3) in the crosswise direction between the screens are smaller than or substantially equal to the pitch (P2) in the lengthwise direction and the pitch (P1) in the crosswise direction of the openings 25 provided in one screen, the metal line portions existing between the respective screens are liable to break. Accordingly, with this point taken into consideration, the pitches (P3, P4) between the screens are preferably wider than the pitches (P1, P2) between the openings 25 constituting one screen. One example of the pitches (P3, P4) between the screens is about 1 mm to about 100 mm. Note that the pitch between the screens means the pitch between the adjacent openings in one screen and another screen adjacent to the one screen. The same similarly applies to the pitch between the openings 25 and the pitch between the screens in the vapor deposition mask of Embodiment (B) mentioned later.

Note that, as shown in FIG. 17, when one slit 15 is provided in the position overlapping the entirety of two or more screens, metal line portions constituting the inner wall surfaces of the slit are not present among the plurality of screens provided in the one slit 15. Accordingly, in this case, the pitch between the two or more screens provided in the position overlapping the one slit 15 may be substantially equal to the pitch between the openings 25 constituting one screen.

Further, on the resin mask 20, grooves (not shown) that extend in the lengthwise direction or the cross wise direction of the resin mask 20 may be formed. While in the case of heat being applied at the time of vapor deposition, there is a possibility that the resin mask 20 thermally expands, and thereby, changes in dimension and position of the opening 25 arise, the expansion of the resin mask can be absorbed by forming the grooves, and the grooves can prevent the changes in dimension and position of the opening 25 caused by the resin mask 20 expanding in a predetermined direction as a whole due to accumulation of thermal expansions arising in respective spots in the resin mask. Formation positions of the grooves are not limited but while they may be provided between the openings 25 constituting one screen, and in positions overlapping the openings 25, they are preferably provided between the screens. Further, the grooves may be provided on one surface of the resin mask, for example, only on the surface on the side that is in contact with the metal mask, or may be provided only on the surface on the side that is not in contact with the metal mask. Alternatively, they may be provided on both surfaces of the resin mask 20.

Further, the grooves extending in the lengthwise direction between the adjacent screens may be made, or the grooves extending in the crosswise direction may be formed between the adjacent screens. Furthermore, the grooves can also be formed in an aspect having these grooves combined.

The depths and the widths of the grooves are not specially limited, but since the rigidity of the resin mask 20 tends to decrease in the case where the depths of the grooves are too large and in the case where the widths thereof are too large, it is necessary to set the depths and the widths with this point taken into consideration. Further, the sectional shapes of the grooves are not specially limited, but only has to be arbitrarily selected as a U-shape, a V-shape or the like with the processing method and the like taken into consideration. The same similarly applies to the vapor deposition mask of Embodiment (B).

As the pressing member 130 which is used when the vapor deposition mask 100 and the vapor deposition target 200 are brought into close contact with each other by using the vapor deposition mask of the aforementioned embodiment (A), the various pressing members 130 described in the above can be properly selected and used, but it is preferable to dispose the pressing member 130 in the position overlapping the one screen in the thickness direction so as to be "the mode A of the preferable pressing member" and "the mode B of the preferable pressing member" described above.

<Vapor Deposition Mask of Embodiment (B)>

Figure 18:
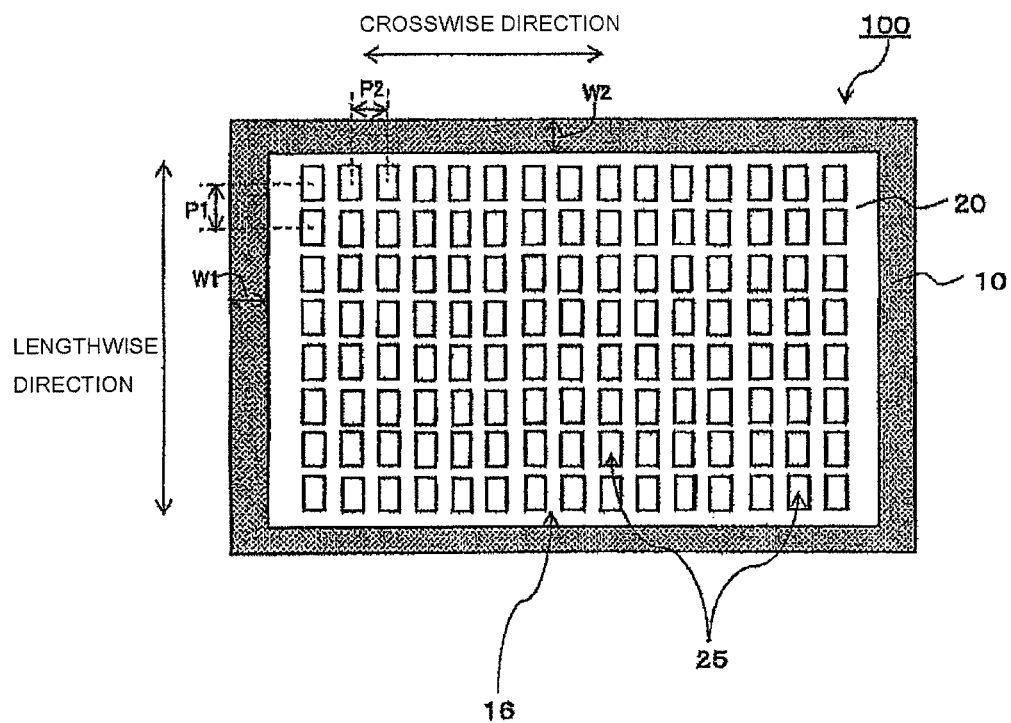
FIG. 18 is an elevation view of a vapor deposition mask in embodiment (B) as seen in plan view from a metal mask side.

Next, the vapor deposition mask of Embodiment (B) is described. As shown in FIG. 18, the vapor deposition mask of Embodiment (B) is characterized in that the vapor deposition mask is formed by stacking the metal mask 10 provided with one slit (one hole 16) on one surface of the resin mask 20 provided with a plurality of openings 25 corresponding to a pattern to be produced by vapor deposition, and all of the plurality of openings 25 are provided in a position overlapping the one hole 16 provided in the metal mask 10.

The opening 25 stated for the vapor deposition mask of Embodiment (B) means an opening needed to form the vapor deposition pattern in the vapor deposition target, and an opening not needed to form the vapor deposition pattern in the vapor deposition target may be provided in a position that does not overlap the one hole 16. Note that FIG. 18 is an elevation view of the vapor deposition mask showing an example of the vapor deposition mask of Embodiment (B) as seen in plan view from a metal mask side.

In the vapor deposition mask 100 of Embodiment (B), the metal mask 10 having the one hole 16 is provided on the resin mask 20 having the plurality of openings 25, and all of the plurality of openings 25 are provided in a position overlapping the one hole 16. In the vapor deposition mask 100 of Embodiment (B) that has this configuration, metal line portions that have the same thickness as the thickness of the metal mask or a larger thickness than the thickness of the metal mask do not exist between the openings 25, so that, as described for the vapor deposition mask of Embodiment (A) mentioned above, the vapor deposition pattern with high definition can be formed to match the dimensions of the openings 25 provided in the resin mask 20 without receiving an interference of metal line portions.

Further, according to the vapor deposition mask of Embodiment (B), an influence of a shadow is hardly received even when the thickness of the metal mask 10 is made large, so that the thickness of the metal mask 10 can be made larger to such an extent that durability and handling ability can be sufficiently satisfied, and while formation of a vapor deposition pattern with high definition is enabled, durability and handling ability can be improved.

The resin mask 20 in the vapor deposition mask of Embodiment (B) is formed from a resin, in which as shown in FIG. 18, the plurality of openings 25 corresponding to a pattern to be produced by vapor deposition are provided in positions overlapping the one hole 16. The openings 25 correspond to the pattern to be produced by vapor deposition, and by a vapor deposition material released from a vapor deposition source passing through the openings 25, the vapor deposition pattern corresponding to the openings 25 is formed in the vapor deposition target. Note that while in the mode shown in the figure, the example in which the openings are arranged in a plurality of rows in the lengthwise direction and the crosswise direction is cited and described, they may be arranged only in the lengthwise direction or in the crosswise direction.

"One screen" in the vapor deposition mask 100 of Embodiment (B) means an aggregate of the openings 25 corresponding to one product, and when the one product is an organic EL display, an aggregate of organic layers needed to form one organic EL display, in other words, an aggregate of the openings 25 to be the organic layers is "one screen". The vapor deposition mask of Embodiment (B) may be constituted of only "one screen", or may be a deposition mask in which the "one screen" is disposed in each of a plurality of screens, and in the case where the "one screen" is disposed in each of a plurality of screens, the openings 25 are preferably provided at predetermined intervals in each screen unit (refer to FIG. 14 for the vapor deposition mask of Embodiment (A)). The mode of "one screen" is not specially limited, but, for example, the one screen can also be constituted of millions of openings 25, when one opening 25 is one pixel.

The metal mask 10 in the vapor deposition mask 100 of Embodiment (B) is formed from a metal and includes the one hole 16. Further, the one hole 16 is disposed in a position overlapping all of the openings 25 as seen from a front of the metal mask 10, in other words, in a position where all of the openings 25 disposed in the resin mask 20 can be seen.

Figure 19:
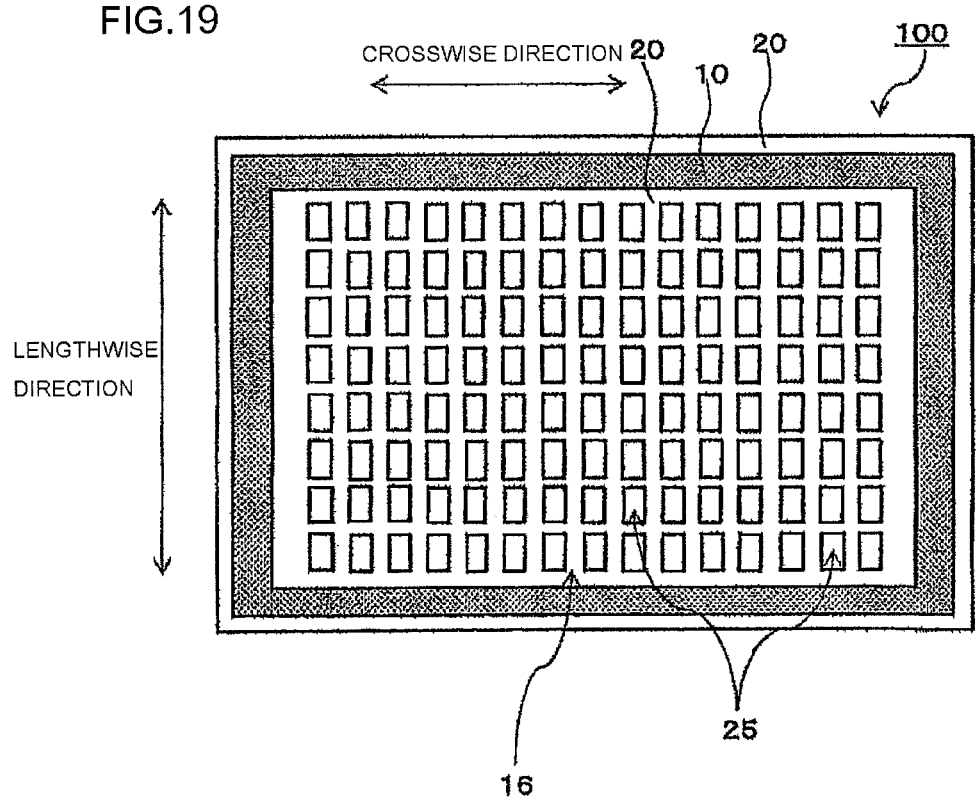
FIG. 19 is an elevation view of the vapor deposition mask in embodiment (B) as seen in plan view from the metal mask side.

The metal portion constituting the metal mask 10, that is, the portion thereof other than the one hole 16 may be provided along an outer edge of the vapor deposition mask 100 as shown in FIG. 18, or the dimension of the metal mask 10 may be made smaller than that of the resin mask 20 to expose an outer peripheral portion of the resin mask 20 as shown in FIG. 19. Further, the dimension of the metal mask 10 may be made larger than that of the resin mask 20, and a part of the metal portion may be caused to protrude outward in the crosswise direction of the resin mask or outward in the lengthwise direction thereof. Note that, in any case, the dimension of the one hole 16 is configured to be smaller than the dimension of the resin mask 20.

A width (W1) in the crosswise direction, and a width (W2) in the lengthwise direction, of the metal portion constituting the wall surface of the one hole 16 of the metal mask 10 shown in FIG. 18 are not specially limited, but as the widths W1 and W2 are made smaller, durability and handling ability tend to reduce more. Accordingly, W1 and W2 are preferably the widths by which durability and handling ability are sufficiently satisfied. Appropriate widths can be properly set in accordance with the thickness of the metal mask 10, and as an example of preferable widths, both W1 and W2 are about 1 mm to about 100 mm, similarly to the widths of the metal mask in the vapor deposition mask of Embodiment (A).

In the vapor deposition mask of Embodiment (B) mentioned above, the metal mask 10 has the one hole 16, and therefore the vapor deposition mask of Embodiment (B) and the magnetic plate 150 attract each other in only the metal portion existing on the outer periphery of the metal mask 10, so that as compared with the vapor deposition mask of Embodiment (A) mentioned above, a gap generated between the vapor deposition mask 100 and the vapor deposition target 200 tends to be larger toward the inner side of the vapor deposition mask 100. Accordingly, in the case of using the vapor deposition mask of Embodiment (B), it is preferable to use the pressing member 130 having a relatively large thickness. As the pressing member 130 which is used in combination with the vapor deposition mask of Embodiment (B), it is preferable to dispose a plurality of independent pressing members 130, or the pressing-plate-integrated type pressing member 140 formed by a plurality of pressing members 130 being fixed to the pressing plate 135 so as to be the aforementioned "mode A of the preferable pressing member", or dispose a large-sized pressing member to be the aforementioned "mode B of the preferable pressing member".

(Example of Metal-Frame-Equipped Vapor Deposition Mask)

As the vapor deposition mask for use in the method for forming a vapor deposition pattern of an embodiment, a metal-frame-equipped vapor deposition mask that is formed by the vapor deposition masks of the various modes described above being fixed to a metal frame can be also used. By using the metal-frame-equipped vapor deposition mask, the vapor deposition mask 100 and the magnetic plate 150 can attract each other also in a frame portion of the metal frame, and coupled with the effect by the pressing member 130 described above, adhesion of the vapor deposition mask 100 and the vapor deposition target 200 can be more enhanced.

Figure 20:
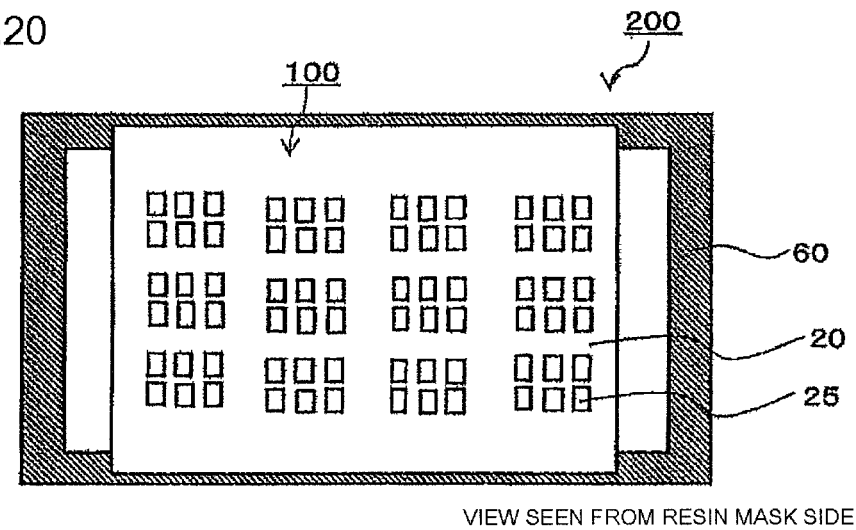
FIG. 20 is an elevation view showing an example of a metal-frame-equipped vapor deposition mask.
Figure 21:
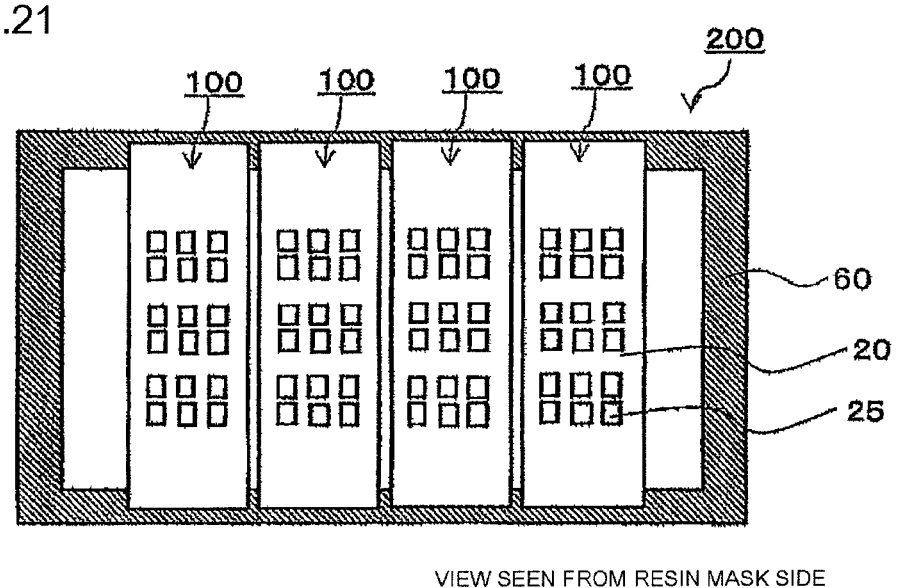
FIG. 21 is an elevation view showing an example of the metal-frame-equipped vapor deposition mask.

The metal-frame-equipped vapor deposition mask 200 for use in the method for forming a vapor deposition pattern of an embodiment may be a metal-frame-equipped vapor deposition mask in which one vapor deposition mask 100 is fixed to a metal frame 60 as shown in FIG. 20, or may be a metal-frame-equipped vapor deposition mask in which a plurality of vapor deposition masks 100 are fixed to the metal frame 60 as shown in FIG. 21.

The metal frame 60 is a frame member in a substantially rectangular shape, and has a through-hole for exposing the openings 25 provided in the resin mask 20 of the vapor deposition mask 100 which is finally fixed, to a vapor deposition source side. Note that when the vapor deposition mask 100 and the magnetic plate 150 can attract each other by the metal portion of the metal mask 10 of the vapor deposition mask, a frame formed from a material other than the metal material, for example, a frame formed from a ceramics material or the like also can be used, for example.

A thickness of the metal frame is not specially limited, but is preferably about 10 mm to about 30 mm from the viewpoint of rigidity and the like. A width between an inner peripheral end surface of an opening of the metal frame and an outer peripheral end surface of the metal frame is not specially limited if only it is a width capable of fixing the metal frame and the metal mask of the vapor deposition mask, and for example, a width of about 10 mm to about 70 mm can be exemplified.

Figure 22A:
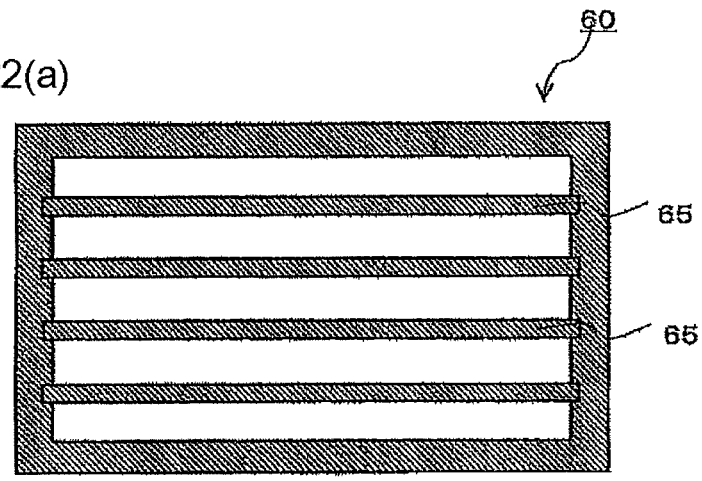
FIGS. 22(a) to 22(c) are elevation views showing examples of a metal frame.
Figure 22B:
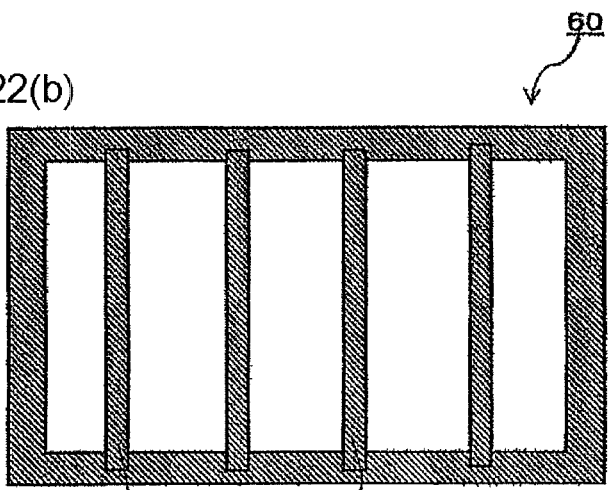
Figure 22C:
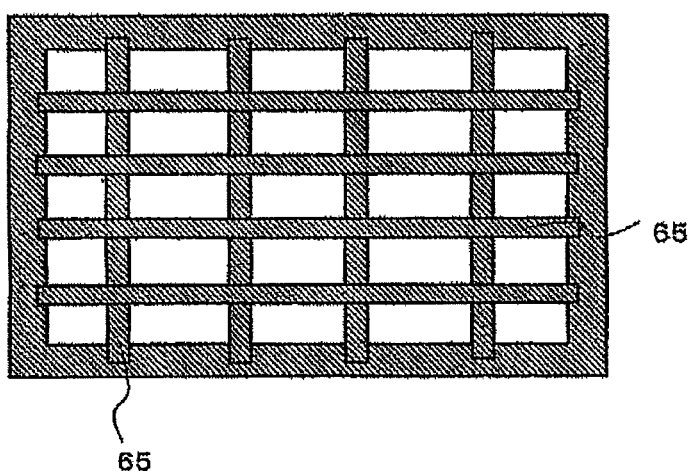

Further, as shown in FIGS. 22(a) to 22(c), the metal frame 60 may be used, in which reinforcing frames 65 or the like are provided in a region of the through-hole of the metal frame within a range without hindering exposure of the openings 25 of the resin mask 20 constituting the vapor deposition mask 100. In other words, the opening of the metal frame 60 may have a structure divided by the reinforcing frames or the like. By providing the reinforcing frames 65, the metal frame 60 and the vapor deposition mask 100 can be fixed by using the reinforcing frames 65. Specifically, when a plurality of vapor deposition masks 100 described above are fixed by being arranged in the lengthwise direction and the cross wise direction, the vapor deposition masks 100 can be also fixed to the metal frame 60 in positions where the reinforcing frames and the vapor deposition masks overlap one another.

Furthermore, by forming the reinforcing frame 65 from a metal material, the metal-frame-equipped vapor deposition mask and the magnetic plate 150 can sufficiently attract each other by using the frame body portion of the metal frame and the reinforcing frame 65, and coupled with the pressing member 130, the metal-frame-equipped vapor deposition mask and the vapor deposition target 200 can be sufficiently brought into close contact with each other without a gap.

While the method for forming a vapor deposition pattern of an embodiment is described thus far by citing the case of using the vapor deposition mask 100 formed by stacking the metal mask 10 provided with the slits 15 and the resin mask 20 provided with the plurality of openings 25 corresponding to the pattern to be produced by vapor deposition, in the positions overlapping the slits 15, as an example, a vapor deposition mask other than this, for example, the vapor deposition mask in which the metal mask 10 is disposed in a part of the effective region of the resin mask 20 described above also can be used, for example. As an example, a vapor deposition mask in which a plurality of metal masks are provided in the effective region of the resin mask 20 described above, and a vapor deposition mask in which a metal mask is disposed in only a region requiring rigidity can be cited. Further, a metal mask having no slit also can be used as the metal mask. Note that as the effective region mentioned here, a region that does not overlap the openings 25 provided in the resin mask 20, a region that does not overlap the frame when the vapor deposition mask is fixed to the frame and the like can be cited. The method for forming a vapor deposition pattern of an embodiment is characterized in that it includes disposing the vapor deposition mask 100 including a metal on one surface side of the vapor deposition target 200, disposing the magnetic plate 150 on the other surface side of the vapor deposition target 200, and bringing the vapor deposition mask 100 and the vapor deposition target 200 into close contact with each other by using the magnetism of the magnetic plate 150, and is not limited to the vapor deposition mask described above. That is, the vapor deposition mask may be any vapor deposition mask as long as the vapor deposition mask includes a metal. As the vapor deposition mask including a metal, a vapor deposition mask in which the material of the resin mask 20 provided with a plurality of openings 25 corresponding to the pattern to be produced by vapor deposition is replaced with a metal material, a vapor deposition mask formed by only a metal mask provided with a plurality of openings corresponding to a pattern to be produced by vapor deposition and the like can be cited. Other than these vapor deposition masks, a vapor deposition mask including a metal can be made by causing a resin mask to contain a metal material to give magnetism to a vapor deposition mask formed of only the resin mask 20 provided with a plurality of openings 25 corresponding to a pattern to be produced by vapor deposition mentioned above.

<Vapor Deposition Pattern Forming Step>

A vapor deposition pattern forming step is a step of causing a vapor deposition material released from the vapor deposition source to adhere to a vapor deposited surface of the vapor deposition target through the openings 25 provided in the vapor deposition mask 100 after the aforementioned close contact step, and forming a vapor deposition pattern on the vapor deposited surface of the vapor deposition target.

A vapor deposition method usable in the method for forming a vapor deposition pattern of an embodiment is not specially limited, and there can be cited, for example, a reactive sputtering method, a vacuum vapor deposition method, physical vapor deposition (Physical Vapor Deposition) such as ion plating and an electron beam vapor deposition method, chemical vapor deposition (Chemical Vapor Deposition) such as thermal CVD, plasma CVD and optical CVD methods and the like. Moreover, formation of a vapor deposition pattern can be performed by using a conventionally known vacuum vapor deposition apparatus or the like.

In the vapor deposition pattern forming step, a vapor deposition pattern is formed on the vapor deposited surface of the vapor deposition target. In the method for forming a vapor deposition pattern of an embodiment, adhesion between the vapor deposition mask 100 and the vapor deposition target 200 can be enhanced and a gap can be restrained from being generated between the vapor deposition mask 100 and the vapor deposition target 200, by the close contact step. Consequently, according to the method for forming a vapor deposition pattern of an embodiment, when a vapor deposition material released from a vapor deposition source passes through the openings in the vapor deposition pattern forming step, the problem of the respective vapor deposition patterns which should be formed at predetermined intervals connecting to each other due to the vapor deposition material going around from the gap, or increase in the vapor deposition pattern dimension and the like can be restrained from occurring, and a high-definition vapor deposition pattern can be formed.

<Method for Forming Vapor Deposition Pattern of Another Embodiment>

Figure 23:
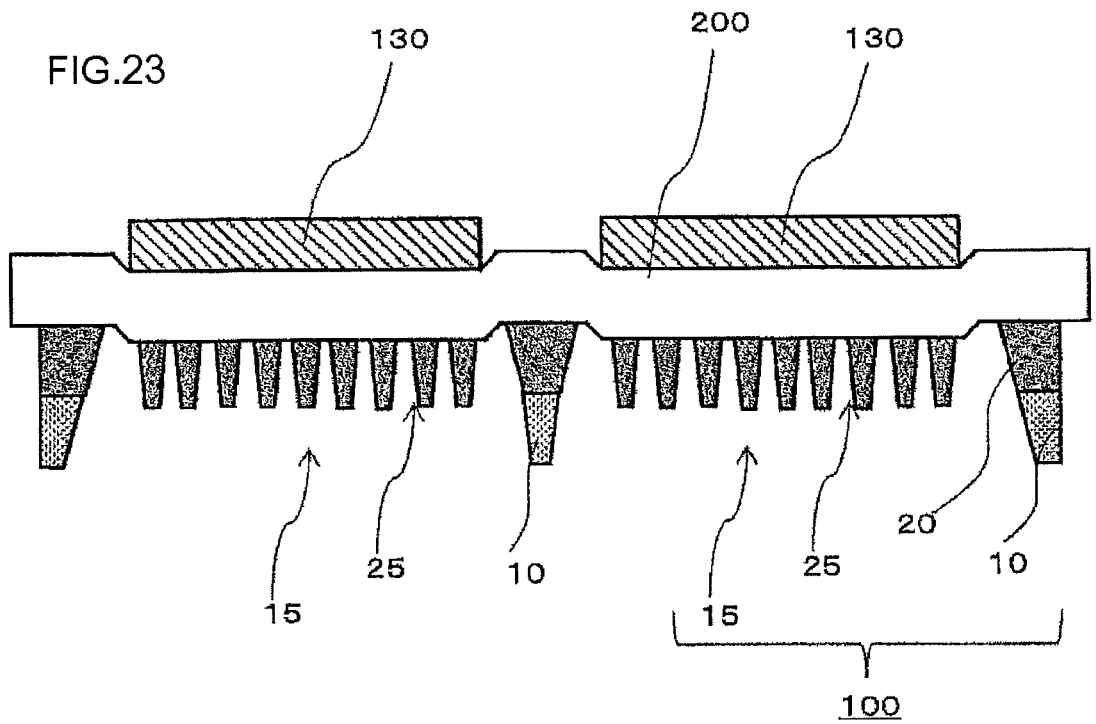
FIG. 23 is a schematic cross-sectional view showing a state at a time of the vapor deposition mask and the vapor deposition target being brought into close contact with each other by using a self weight of the pressing member.
Figure 24:
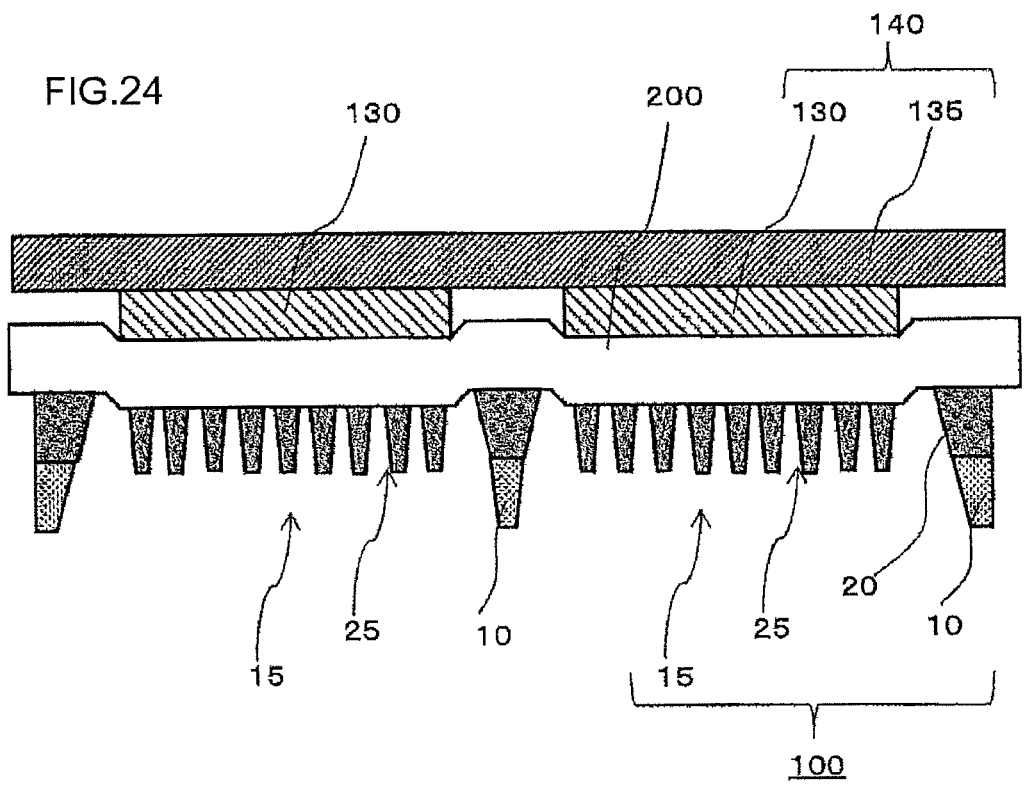
FIG. 24 is a schematic cross-sectional view showing a state at a time of the vapor deposition mask and the vapor deposition target being brought into close contact with each other by using a self weight of the pressing-plate-integrated type pressing member.

A method for forming a vapor deposition pattern of another embodiment is a method for forming a vapor deposition pattern that forms a vapor deposition pattern in a vapor deposition target by using a vapor deposition mask provided with a plurality of openings corresponding to a pattern to be produced by vapor deposition, and as shown in FIG. 23 and FIG. 24, is characterized by including a close contact step of disposing the vapor deposition mask 100 on one surface side (an undersurface side in a mode shown in the figures) of the vapor deposition target 200, disposing the pressing member 130 on the other surface side (a top surface side in the mode shown in the figures) of the vapor deposition target 200, and pressing the vapor deposition target 200 to the vapor deposition mask 100 side by the self weight of the pressing member 130 to bring the vapor deposition mask 100 and the vapor deposition target 200 into close contact with each other, and a vapor deposition pattern forming step of causing a vapor deposition material released from a vapor deposition source to adhere to the vapor deposition target 200 through the openings 25 after the close contact step, and forming a vapor deposition pattern in the vapor deposition target 200. FIG. 23 and FIG. 24 are schematic cross-sectional views showing a state in which a vapor deposition mask and a vapor deposition target are brought into close contact with each other by a self weight of the pressing member 130 or the pressing-plate-integrated type pressing member 140, by using the pressing member 130, or the pressing-plate-integrated type pressing member 140.

The method for forming a vapor deposition pattern of another embodiment differs from the method for forming a vapor deposition pattern of an embodiment mentioned above in a point that the magnetic plate 150 is not an essential constituent element.

To be specific, the method for forming a vapor deposition pattern of another embodiment differs from the method for forming a vapor deposition pattern of an embodiment mentioned above only in (i) a point that the magnetic plate is not an essential constituent element (ii) a point that the pressing member is pressed without using a magnetic plate, and except for the different points, is common to the method for forming a vapor deposition pattern of an embodiment mentioned above. Accordingly, in the method for forming the vapor deposition pattern of another embodiment, various aspects described for the method for forming a vapor deposition pattern of an embodiment mentioned above can be properly selected and used, except for the different points. For example, the mode of the pressing member, arrangement positions and the like are common to the method for forming a vapor deposition pattern of an embodiment mentioned above.

In the method for forming a vapor deposition pattern of another embodiment, the magnetic plate is not an essential constituent element, the pressing member 130 is disposed on the other surface side (the top surface side in the mode shown in the figures) of the vapor deposition target 200, the pressing member 130 is pressed to the vapor deposition mask 100 side by an appropriate device, and the vapor deposition mask and the vapor deposition target are brought into close contact with each other. Accordingly, in the method for forming a vapor deposition pattern of another embodiment, a vapor deposition mask that includes no metal, for example, a vapor deposition mask formed of only the resin mask 20 provided with the openings 25 corresponding to a pattern to be produced by vapor deposition also can be used, for example. Note that in the method for forming a vapor deposition pattern of another embodiment, the vapor deposition masks described in the method for forming a vapor deposition pattern of an embodiment in the above also can be used directly. Further, conventionally known vapor deposition masks other than these vapor deposition masks also can be properly selected and used.

In the method for forming a vapor deposition pattern of another embodiment, a method for pressing the pressing member 130 disposed on the other surface side of the vapor deposition target 200 to the vapor deposition mask 100 side is not specially limited, and there can be cited the method for pressing the pressing member 130 to the vapor deposition mask 100 side by the self weight of the pressing member 130, a method for pressing the pressing member 130 to the vapor deposition mask 100 side by holding the pressing member 130 with a driving device, and driving the driving device which holds the pressing member, and the like. Further, in place of the method for holding the pressing member 130 with the driving devise, a driving device is brought into contact with the pressing member 130, and the driving device which is brought into contact with the pressing member 130 is driven toward the vapor deposition mask 100 side, whereby the pressing member 130 also can be pressed to the vapor deposition mask 100 side. Further, pressing the pressing member 130 to the vapor deposition mask side mentioned in the specification of the present application also includes a mode of pressing the vapor deposition mask 100 toward the pressing member 130 side, in addition to the mode of pressing the pressing member 130 toward the vapor deposition mask 100 side. For example, the vapor deposition mask 100 is held by the driving device, or the vapor deposition mask 100 is brought into contact with the driving device, and the driving device may be driven toward the pressing member 130 side.

While a mass and a dimension of the pressing member 130 in the case of using the method for pressing the pressing member 130 to the vapor deposition mask 100 side by the self weight of the pressing member are not specially limited, the mass and the dimension only have to be at least the mass and dimension by which the vapor deposition target 200 can be pressed to the vapor deposition mask 100 side by the self weight thereof. The mass and the dimension of the pressing member 130 can be properly set in accordance with the material of the vapor deposition target 200, the thickness of the vapor deposition target 200 and the like. As a material of the pressing member 130, use of a material having a mass per unit volume of about 2.0 g/cm³ or more is preferable, and use of a material having a mass per unit volume of about 2.5 g/cm³ or more is more preferable, for example.

Moreover, as shown in FIG. 23, when the pressing members 130 are individually disposed on the other surface side of the vapor deposition target 200, the mass of each of the pressing members 130 is preferably about 50 g or more, and is more preferably about 100 g or more.

Note that as shown in FIG. 24, the case of using the pressing-plate-integrated type pressing member 140 formed by fixing one or a plurality of pressing members 130 to the pressing plate 135 (in a mode shown in the figure, a plurality of pressing members 130 are fixed to the pressing plate 135) is preferable in a viewpoint of being able to increase the entire mass. Further, the pressing members 130 can be accurately disposed on the other surface side of the vapor deposition target 200.

Moreover, in a case where a force that presses the vapor deposition target 200 to the vapor deposition mask 100 side by the pressing member 130 is weak or the like, a weight (not shown in the figure) is placed on the pressing member 130, the pressing plate 135 or the pressing-plate-integrated type pressing member 140, and the pressing force can be made strong.

Further, by using a drive mechanism, the pressing member 130 disposed on the other surface side of the vapor deposition target 200 also can be pressed to the vapor deposition mask side. The drive mechanism only has to have a function of being able to hold the pressing member 130, and being able to move the held pressing member 130 in an arbitrary direction.

<<Pressing-Plate-Integrated Type Pressing Member>>

Next, the pressing-plate-integrated type pressing member of an embodiment of the present disclosure (Hereafter, referred to as the pressing-plate-integrated type pressing member of an embodiment.) is described. The pressing-plate-integrated type pressing member of an embodiment is (1) a pressing-plate-integrated type pressing member that is disposed between a vapor deposition target and a magnetic plate when a vapor deposition mask is disposed on one surface side of the vapor deposition target, the magnetic plate is disposed on the other surface side of the vapor deposition target, and the vapor deposition target and the vapor deposition mask are brought into close contact with each other by using the magnetic force of the magnetic plate, or (2) a pressing-plate-integrated type pressing member that is disposed on the other surface side of the vapor deposition mask when the vapor deposition mask is disposed on the one surface side of the vapor deposition target, and is used to bring the vapor deposition target and the vapor deposition mask into close contact with each other by using the self weight thereof, and is characterized by being the pressing-plate-integrated type pressing member 140 in which one or a plurality of pressing members 130 are provided on a surface of the pressing plate 135. According to the pressing-plate-integrated type pressing member of an embodiment, the pressing-plate-integrated type pressing member is disposed between the vapor deposition target and the magnetic plate, and the vapor deposition mask 100 and the vapor deposition target 200 are brought into close contact with each other, whereby a gap can be restrained from being generated between the vapor deposition mask and the vapor deposition target. Further, without using the magnetic plate, the vapor deposition mask 100 and the vapor deposition target 200 can be brought into close contact with each other without a gap by pressing the pressing-plate-integrated type pressing member 140 to the vapor deposition mask 100 side by using the self weight of the pressing-plate-integrated type pressing member 140 disposed on the other surface side of the vapor deposition target 200, or driving the drive mechanism holding the pressing-plate-integrated type pressing member.

As the pressing-plate-integrated type pressing member of an embodiment, the pressing-plate-integrated type pressing member 140 described in the method for forming a vapor deposition pattern mentioned above can be directly used, and detailed explanation is omitted here.

The pressing member 130 and the pressing plate 135 which constitute the pressing-plate-integrated type pressing member 140 may be respectively formed from different materials, or the same kind of material. Further, the pressing member 130 and the pressing plate 135 may be formed from the same kind of material, and formed integrally with each other.

<<Vapor Deposition Apparatus>>

Next, a vapor deposition apparatus of an embodiment of the present disclosure (Hereafter, referred to as a vapor deposition apparatus of an embodiment.) is described. The vapor deposition apparatus of an embodiment is a vapor deposition apparatus for forming a vapor deposition pattern on a vapor deposition target, and has a feature in a point of including a close contact device for bringing the vapor deposition target and a vapor deposition mask into close contact with each other in a stage before forming the vapor deposition pattern on the vapor deposition target, wherein the close contact device is (1) a device that disposes the vapor deposition mask on one surface side of the vapor deposition target, disposes a pressing member and a magnetic plate in layer in this order on the other surface side of the vapor deposition target, and brings the vapor deposition target and the vapor deposition mask into close contact with each other by using magnetism of the magnetic plate, or is (2) a device that disposes the vapor deposition mask on one surface side of the vapor deposition target, disposes the pressing member on the other surface side of the vapor deposition target, and presses the pressing member to the vapor deposition mask side to bring the vapor deposition target and the vapor deposition mask into close contact with each other. In (2), by the self weight of the pressing member, or driving a driving device that holds the pressing member, for example, the pressing member is disposed on the other surface side of the vapor deposition target, and the pressing member can be pressed to the vapor deposition mask side.

That is, the aforementioned vapor deposition apparatus is characterized by including a mechanism for performing the close contact step described in the methods for forming a vapor deposition pattern of an embodiment mentioned above and another embodiment. As for the portions other than the close contact device, the respective components of the conventionally known vapor deposition mask producing apparatus can be properly selected and used. According to the vapor deposition apparatus of an embodiment, in the step before forming the vapor deposition pattern in the vapor deposition target, the vapor deposition mask and the vapor deposition target can be brought into close contact with each other without a gap, and a high-definition vapor deposition pattern can be formed.

<<Method for Producing Organic Semiconductor Element>>

Next, a method for producing an organic semiconductor element of an embodiment of the present disclosure (Hereafter, referred to as a method for producing an organic semiconductor element of an embodiment.) is described. A method for producing an organic semiconductor element of an embodiment is characterized by including a step of forming a vapor deposition pattern in a vapor deposition target by using a vapor deposition mask, wherein in the step of forming the vapor deposition pattern, the method for forming a vapor deposition pattern of an embodiment mentioned above, and the vapor deposition apparatus of an embodiment described above are used.

The step of forming a vapor deposition pattern by a vapor deposition method using a vapor deposition mask is not specially limited, and an electrode forming step of forming an electrode on a substrate, an organic layer forming step, a counter electrode forming step, a sealing layer forming step and the like are included, and in each of arbitrary steps, the vapor deposition pattern is formed by using the method for forming a vapor deposition pattern of an embodiment described above. For example, when the method for forming a vapor deposition pattern of an embodiment described above is applied respectively to a light emitting layer forming step of respective colors of R (red), G (green) and B (blue) of an organic EL device, vapor deposition patterns of the light emitting layers of the respective colors are formed on the substrate. Note that the method for producing an organic semiconductor element of an embodiment is not limited to these steps, but is applicable to an arbitrary step in production of an organic semiconductor element that is conventionally known.

According to the method for producing an organic semiconductor element of an embodiment described above, vapor deposition for forming an organic semiconductor element can be performed in a state where the vapor deposition mask and the vapor deposition target are brought into close contact with each other without a gap, and a high-definition organic semiconductor element can be produced. As an organic semiconductor element produced by the method for producing an organic semiconductor element of an embodiment, an organic layer, a light emitting layer, a cathode electrode and the like of an organic EL element can be cited, for example. In particular, the method for producing an organic semiconductor element of an embodiment can be preferably used in production of R (red), G (green) and B (blue) light emitting layers of an organic EL element from which high-definition pattern precision is required. Moreover, an organic semiconductor device also can be produced by using the organic semiconductor element formed by using the method for producing an organic semiconductor element of an embodiment.

REFERENCE SIGNS LIST

10 Metal mask
15 Slit
20 Resin mask
25 Opening
60 Metal frame
100 Vapor deposition mask
130 Pressing member
135 Pressing plate
140 Pressing-plate-integrated type pressing member
150 Magnetic plate
200 Vapor deposition target

The invention claimed is:

1. A method for forming a vapor deposition pattern using a vapor deposition mask provided with a plurality of openings corresponding to a pattern that is produced by vapor deposition, and forming the pattern in a vapor deposition target, the method comprising:

a close contact step of disposing the vapor deposition mask on one surface side of the vapor deposition target, disposing an integrated pressing member-pressing plate assembly on the other surface side of the vapor deposition target, and pressing a pressing member of the assembly disposed on the other surface side of the vapor deposition target to the vapor deposition mask side to bring the vapor deposition target and the vapor deposition mask into close contact with each other; and a vapor deposition pattern forming step of causing a vapor deposition material released from a vapor deposition source to adhere to the vapor deposition target through the openings after the close contact step, and forming a vapor deposition pattern in the vapor deposition target, wherein in the close contact step, the vapor deposition target is pressed to the vapor deposition mask by a self weight of the pressing member-pressing plate assembly, a pressing plate of the assembly is disposed on a surface of the pressing member that is not in contact with the vapor deposition target in such a manner as to cover a surface of the pressing member, wherein the vapor deposition mask includes a metal mask, provided with a plurality of slits, and a resin mask, provided with openings needed to configure a plurality of screens, stacked on the metal mask, and each of the slits is provided in a position overlapping at least one entire screen, wherein, in the close contact step, the pressing member is disposed in at least one portion of a region overlapping each slit in a thickness direction, on the other surface side of the vapor deposition target, and wherein the pressing member is fixed to the pressing plate.

2. The method for forming a vapor deposition pattern according to claim 1, wherein a thickness of the pressing member changes continuously or non-continuously toward an inner side from an outer periphery of the pressing member.

3. The method for forming a vapor deposition pattern according to claim 1, wherein a thickness of the pressing member becomes larger continuously or non-continuously toward an inner side from an outer periphery of the pressing member.

4. The method for forming a vapor deposition pattern according to claim 1, wherein in the close contact step, a plurality of pressing members having different thicknesses are disposed on the other surface side of the vapor deposition target.

5. The method for forming a vapor deposition pattern according to claim 4, wherein in the close contact step pressing members having larger thicknesses are disposed toward an inner side from an outer periphery of the vapor deposition target.

6. The method for forming a vapor deposition pattern according to claim 1, wherein the vapor deposition mask is a metal-frame-equipped vapor deposition mask formed by the vapor deposition mask fixed to a metal frame.

\* \* \* \* \*